United States Patent [19]

Tamura et al.

[11] Patent Number: 5,072,245
[45] Date of Patent: Dec. 10, 1991

[54] IMAGE RECORDING APPARATUS EMPLOYING OPTICAL AND HEAT ENERGY TO RECORD IMAGE

[75] Inventors: Yasuyuki Tamura, Yokohama; Shuzo Kaneko, Tokyo; Tadashi Sato, Tokyo; Shinnosuke Taniishi, Tokyo, all of Japan

[73] Assignee: Canon Kabushiki Kaisha, Tokyo, Japan

[21] Appl. No.: 477,147

[22] Filed: Feb. 8, 1990

Related U.S. Application Data

[63] Continuation of Ser. No. 8,914, Jan. 30, 1987, abandoned.

[30] Foreign Application Priority Data

| Feb. 3, 1986 | [JP] | Japan | 61-21632 |
| Feb. 3, 1986 | [JP] | Japan | 61-21633 |
| Feb. 3, 1986 | [JP] | Japan | 61-21634 |
| Feb. 10, 1986 | [JP] | Japan | 61-25799 |
| Feb. 10, 1986 | [JP] | Japan | 61-25800 |
| Dec. 2, 1986 | [JP] | Japan | 61-287061 |
| Dec. 2, 1986 | [JP] | Japan | 61-287062 |
| Dec. 2, 1986 | [JP] | Japan | 61-287063 |

[51] Int. Cl.[5] .................. G01D 15/10; G03G 5/16; G03C 5/16
[52] U.S. Cl. .................. 346/76 PH; 250/318; 250/319; 355/279
[58] Field of Search .......... 250/316.1, 317.1, 318, 250/319; 346/76 PH, 157; 355/200, 210, 271, 277, 279

[56] References Cited

U.S. PATENT DOCUMENTS

| 3,157,102 | 11/1964 | Pfaff | 250/319 X |
| 3,627,982 | 12/1971 | Sagawa | 250/318 X |
| 4,076,532 | 2/1978 | Gottermeier | 250/316.1 X |
| 4,080,897 | 3/1978 | Gundlach | 250/316.1 X |
| 4,446,467 | 5/1984 | Takiguchi et al. | 346/76 PH |
| 4,454,517 | 6/1984 | Kagaya | 346/76 PH X |
| 4,518,645 | 5/1985 | Moriguchi et al. | 428/212 |

FOREIGN PATENT DOCUMENTS

| 0098033 | 1/1984 | European Pat. Off. |
| 2508259 | 12/1982 | France |
| 2550036 | 2/1985 | France |
| 1292163 | 10/1972 | United Kingdom |
| 2145529 | 3/1985 | United Kingdom |
| 2113860 | 11/1985 | United Kingdom |

OTHER PUBLICATIONS

Patent Abstracts of Japan, vol. 7, No. 79 (M-204) [1224] 3/1983.
Patent Abstracts of Japan, vol. 7, No. 261 (M-257) [1406] 11/1983.

*Primary Examiner*—Fred L. Braun
*Attorney, Agent, or Firm*—Fitzpatrick, Cella, Harper & Scinto

[57] ABSTRACT

An image recording apparatus which includes a conveying device for conveying a transfer recording medium having a transfer recording layer whose transfer characteristics change when a first energy and a second energy different from the first energy are applied thereto. A recording section is disposed along a conveying route of the transfer recording medium conveyed by the conveying device and having a first energy applying device for applying the first energy to the transfer recording medium and a second energy applying device for applying the second energy thereto. A tension imparting device is used for imparting tension to the transfer recording medium in such a manner that the transfer recording medium is pressed against the first energy applying device. A transfer device for transferring an image formed on the transfer recording medium in the recording section to a recording medium and a conveying device for conveying the recording medium to a discharge section via the transfer device are also employed.

54 Claims, 17 Drawing Sheets

A: NOT IRRADIATED
B: IRRADIATED

IMAGE RECORDING APPARATUS EMPLOYING OPTICAL AND HEAT ENERGY TO RECORD IMAGE

This application is a continuation of application Ser. No. 008,914 filed Jan. 30, 1987, now abandoned.

BACKGROUND OF THE INVENTION

1. Field of the Invention

The present invention relates to an image recording apparatus applicable to printers, copying machines, electronic typewriters, facsimile equipment, and the like.

2. Related Background Art

In recent years, various kinds of information processing systems have been developed in conjunction with rapid progress made in the information industry, and recording methods and apparatus suitable for various information processing systems have also been developed and adopted. Among such recording methods, the thermal transfer recording method has recently been used widely, since the associated apparatus may be light in weight, compact and noise-free as well as excelling in terms of operational features and maintenance capabilities.

This heat transfer recording method is generally effected as follows A heat transfer medium is used in which a thermal transfer ink with a coloring agent dispersed in a heat melting binder is applied to a sheet-like substrate, and this thermal transfer medium is superposed on a recording medium in such a manner that a thermal transfer ink layer will contact the recording medium. By supplying heat from the side of the thermal transfer medium's substrate by means of a thermal head to transfer the melted ink layer to the recording medium, a transferred ink image corresponding to the configuration of the heat supplied is formed on the recording medium. In accordance with this method, plain paper can be used as the recording medium.

However, conventional thermal transfer recording methods are not free from problems. In other words, with conventional thermal transfer recording methods, the transfer recording performance, i.e., the printing quality, is substantially affected by the smoothness of the surface of the recording medium. In the case of a recording medium with a low degree of smoothness, there is a possibility of this resulting in a decline in the quality of images recorded.

In addition, if a multi-color image is to be obtained using a conventional thermal transfer recording apparatus, it is necessary to provide a plurality of thermal heads or provide the transfer recording medium or the recording medium with complicated functions such as reverse feeding and stopping. Thus, there are problems in that the overall apparatus becomes large in size and complex, and that the recording speed declines.

Therefore, the present applicant invented image recording methods and transfer recording media which allow high-quality images to be recorded on a recording medium having a low degree of surface smoothness by overcoming the aforementioned problems of the prior art. In addition, the present applicant invented image recording methods and transfer recording media which allow multi-color images to be obtained without needing to have the recording medium perform complicated functions. The present applicant filed patent applications in Japan for these inventions as Japanese Patent Application Nos. 120080/1985 (filed on June 3, 1985), 120081/1985 (filed on June 3, 1985), 131411/1985 (filed on June 17, 1985), 134831/1985 (filed on June 20, 1985), 150597/1985 (filed on June 7, 1985), 199926/1985 (filed on Sep. 10, 1985), and 250884/1985 (filed on Nov. 11, 1985). Furthermore, on the basis of the priority rights afforded by these Japanese applications, the present applicant filed an application in the United States (U.S. Ser. No. 869,689, filed on June 2, 1985) and a European application (Application No. 86107540.6, filed on June 3, 1986).

The present invention which will be described below is a further development of the aforementioned inventions for which the present applicant filed the Japanese applications, the U.S. application, and the European application. The present invention can be applied, as necessary, to the image recording methods and transfer recording media described in the specifications of the aforementioned applications.

SUMMARY OF THE INVENTION

A primary object of the present invention is to provide an image recording apparatus which is capable of forming high-quality images on a recording medium with a low degree of surface smoothness (e.g., plain paper).

Another object of the present invention is to provide an image recording apparatus which is capable of forming clear images.

Still another object of the present invention is to provide an image recording apparatus which is capable of recording at high speed.

A further object of the present invention is to provide an image recording apparatus which is capable of effecting half-tone recording.

A still further object of the present invention is to provide an image recording apparatus which is capable of obtaining multi-color recorded images without the need to have a transfer recording medium or a recording medium perform complicated functions.

A further object of the present invention is to provide an image recording apparatus which is capable of pressing a transfer recording medium against a thermal head or the like using tension, without any need to press the transfer recording medium by means of a platen or the like as in the case of a conventional method.

A yet further object of the present invention is to provide an image recording apparatus which is capable of effecting in separate processes the formation of images on a transfer recording medium and the transfer of the images to a recording medium.

These and other objects and features of the present invention will become apparent from the following detailed description of the invention when read in conjunction with the accompanying drawings

BRIEF DESCRIPTION OF THE DRAWINGS

FIGS. 2a to 2e partial diagrams illustrating the relationships between a multi-color transfer recording medium and thermal heads, in which FIG. 2e is a partial diagram illustrating the relationships between a multi-color transfer recording medium and a recording medium;

DESCRIPTION OF THE PREFERRED EMBODIMENTS

Referring now to the accompanying drawings, description will be made of embodiments of an image recording apparatus in accordance with the present invention. As mentioned before, it goes without saying that the embodiments of the present invention can, as necessary, be applied to the image recording methods and transfer recording media described in the specifications of the aforementioned applications.

In an image recording apparatus in accordance with the present invention, a transferred image is formed by varying the physical properties governing the transfer characteristics. These physical properties are determined, as required, in accordance with the kinds of transfer recording media used. For instance, in the case of a transfer recording medium in which transfer is effected after rendering a transfer image in a thermally melted state, the physical properties are determined by the melting temperature, the softening temperature, or the glass transition point. In the case of a transfer recording medium in which transfer is effected after rendering a transfer image in an adhesive state or in a state in which it is capable of permeating a recording medium, the physical properties are determined by the viscosity at an identical temperature. In addition, a plurality of kinds of energy used for forming a transfer image can also be determined as required. For instance, optoelectronic beams, heat, pressure, or the like may be used in a suitable combination.

Figure 1A:
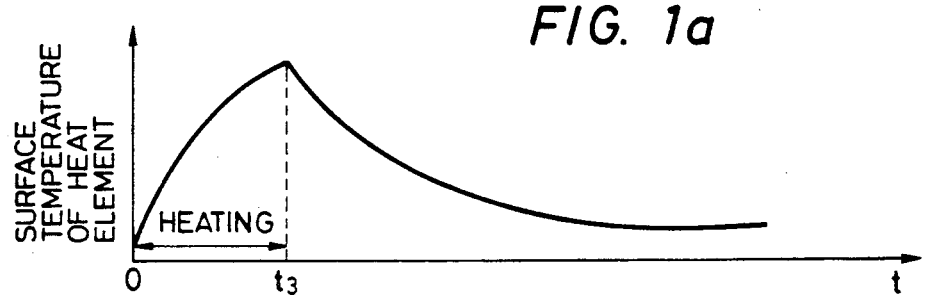
FIGS. 1a to 1d are diagrams explaining the basic principle of the formation of transferred images in cases where transferred images are formed by means of light and heat energy.

First, with reference to FIGS. 1a to 1d, description will be made of an image forming method which is applied to an image recording apparatus in accordance with the present invention. The time axes (the axes of abscissa) in the respective graphs in FIGS. 1a to 1d correspond to each other. In addition, reaction initiators and high molecular components, etc., which will be described later, are included among the sensitizing components in a transfer recording layer. FIG. 1a shows a rise in the surface temperature of a heating element, such as a thermal head, in a case where the heating means is heated for a period of 0–t3, as well as a subsequent temperature drop.

Figure 1B:
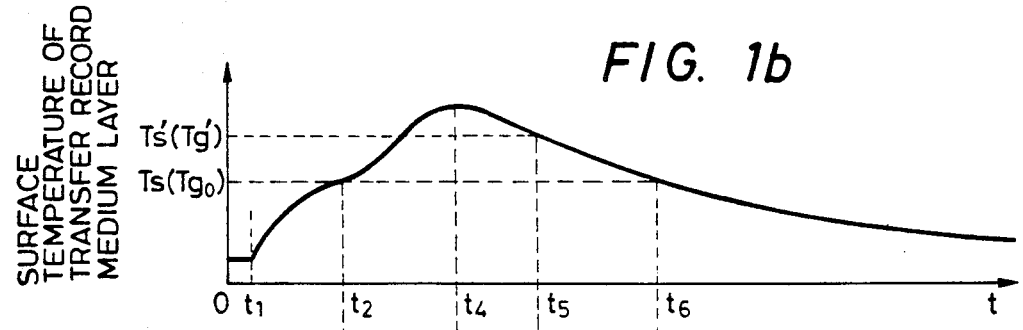
Figure 1C:
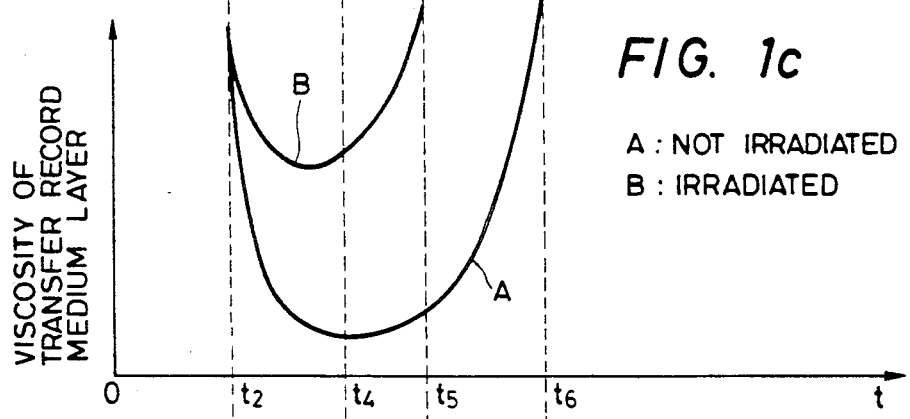
Figure 1D:
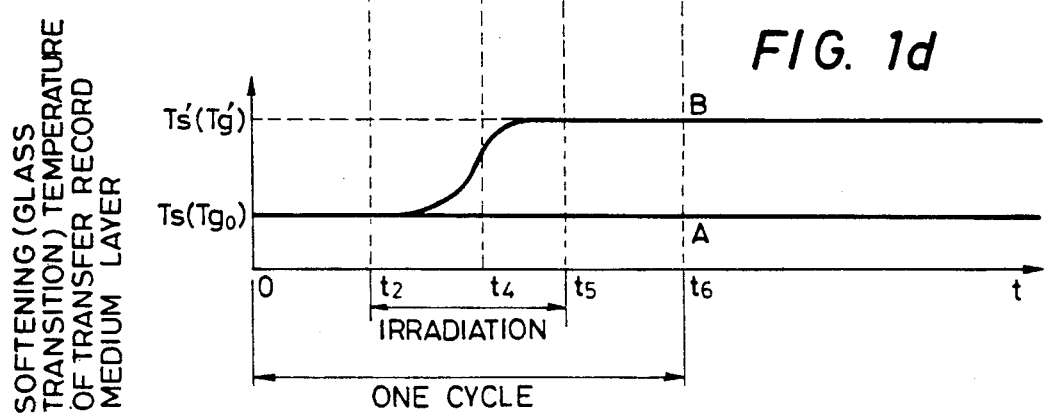

A transfer recording medium pressure-contacted by this heating means exhibits a temperature change as shown in FIG. 1b in conjunction with the temperature change in the heating means. In other words, its temperature rises with a time lag of t1, reaches its maximum temperature at a timing of t4 which similarly lags behind t3, and subsequently drops. This transfer recording layer has a softening temperature of Ts and softens suddenly in the temperature region above Ts, resulting in a decline in its viscosity at that point. This pattern is shown by the curve A in FIG. 1c. The decline in viscosity continues after reaching Ts at a timing t2 until a timing t4. As the temperature drops, the viscosity increases again and shows a sharp increase until a timing t6 when the temperature drops to Ts. In this case, the transfer recording layer is basically not subjected to any change in physical properties in comparison with its state before heating, and the transfer recording layer, if heated to the temperature Ts or above in the subsequent transfer process, shows a decline in viscosity, as described above. Accordingly, if the transfer recording layer is pressure-contacted by a recording medium and is heated to an appropriate temperature for transfer, for example, above Ts, the transfer recording layer is transferred for the same reason as that with the transfer mechanism of a conventional thermal transfer recording. However, in the case of this example, if, as shown in FIG. 1d, irradiation with light is carried out simultaneously with heating from the timing t2, the transfer recording layer softens, and if, for example, a reaction initiator contained in the transfer recording layer is activated, causing the temperature to rise sufficiently to increase the reaction speed, the probability of polymerization of a polymerizable monomer increases remarkably, with the result that the rate of hardening rises sharply. If heating and irradiation are carried out simultaneously, the transfer recording layer shows behavior of the sort shown by the curve B in FIG. 1c. Subsequently, the reaction advances, the softening temperature rises, and the temperature changes from Ts to Ts' at a timing t5 when the reaction is completed. Correspondingly, the transfer start temperature, i.e., a temperature at which the transfer recording layer starts the transfer process, also changes. This pattern is shown in FIG. 1d. Accordingly, if heating is conducted in the subsequent transfer process, a difference in the properties arises between portions whose temperature has changed to Ts' and those portions whose temperature has not so changed. In consequence, if heating is carried out to a temperature of Tr, which satisfies Ts<Tr<Ts', a difference arises between portions whose viscosity has declined and portions whose viscosity has not changed. Thus only the portion whose viscosity has declined is transferred to the recording medium. Although it depends upon complete temperature stability, Ts'−Ts at this time should preferably be approximately 20° C. Thus a transfer image can be formed by controlling the heating or lack of heating and by effecting irradiation simultaneously in accordance with image signals.

The melting temperature and the glass transition point are also conceivable in addition to the softening temperature as being physical properties that govern the transfer characteristics of the transfer recording layer, as well as the softening temperature. In the respective cases, latent images are formed in the transfer recording layer by making use of irreversible changes in such factors as the melting temperature and the glass transition point before or after the imparting of a plurality of types of energy. The softening point, the melting temperature, and the glass transition point all change showing substantially similar trends. Accordingly, the foregoing description based on an explanation with respect to the softening point also applies to cases where the melting temperature or the glass transition point are used. (The case of using the glass transition point is shown in parentheses in FIGS. 1b and 1d.

It goes without saying that this image forming method is applicable to the formation of single color images, but a method of forming multi-color images will be described hereafter with reference to the foregoing description.

FIGS. 2a to 2d are partial diagrams illustrating the relationships between a multi-color transfer recording medium and a thermal head. Heat energy modulated in accordance with an image recording signal is applied together with light energy of a wavelength selected in accordance with the tone of an image-forming element which is used to change the physical properties governing the transfer characteristics. It should be noted that the "modulation" referred to herein means the change of the position at which the energy is imparted in correspondence with an image signal, and that "together with" is meant to refer to both a case where both the light energy and heat energy are imparted simultaneously, and a case where the light energy and heat energy are imparted separately.

In this example, the light energy is imparted from the side of the transfer recording layer of the transfer recording medium so as to improve the irradiation effect of the light.

In FIGS. 2a to 2d, a multi-color transfer recording medium 1 is arranged by providing a transfer recording layer 1a on a base film 1b. The transfer recording layer 1a is a layer in which fine image-forming elements 31, which give different tones, are distributed. For instance, in the embodiment shown in FIGS. 2a to 2c, any of the colorants of cyan (C), magenta (M), yellow (Y), and black (K) may be contained in the respective image-forming elements 31. However, the colorants contained in the respective image-forming elements 31 need not be restricted to cyan, magenta, yellow, and black, and any colors may be used to suit a particular usage. The image-forming elements 31 contain in addition to the colorants a sensitizing component which, when light and heat energies are applied thereto, causes a sudden change in the physical properties governing the transfer characteristics. Incidentally, the image-forming elements 31 may be provided on the substrate 1b by means of a binder or may be fused thereto by heating.

The sensitizing component of each of the image-forming elements 31 possesses wavelength dependency in accordance with the colorant contained. Specifically, in the case of the image-forming element 31 containing the colorant of yellow, when heat and a light beam having a wavelength $\lambda$ (Y) is applied thereto, crosslinking proceeds suddenly, and hardening then takes place. Similarly, in the cases of the image-forming element 31 containing the colorant of magenta, the one containing the colorant of cyan, and the one containing the colorant of black, the reaction proceeds and hardening takes place when, respectively, heat and a light beam having a wavelength $\lambda$ (M), heat and a light beam having a wavelength $\lambda$ (C), and heat and a light beam having a wavelength $\lambda$ (K) are applied thereto. The hardened image-forming elements 31, even if heated in the subsequent transfer process, are not transferred onto the recording medium since their viscosity does not decline. At this time, heat and light are applied in correspondence with the relevant recording information.

In accordance with this method of forming multi-color images, the transfer recording medium 1 is superposed on a thermal head, and the light is applied in such a manner as to cover the entire region of the heat-generating portion of the thermal head 2. As for the light applied, light beams having wavelengths which cause the image-forming elements 31 to react therewith are applied consecutively. For instance, in a case where the image-forming elements 31 are colored by the respective colors of cyan, magenta, yellow, and black, light beams having the wavelengths $\lambda$ (C), $\lambda$ (M), $\lambda$ (Y), $\lambda$ (K) are applied consecutively.

In other words, the recording layer 1a is irradiated with light having the wavelength $\lambda$ (Y) from the side of the transfer recording layer 1a of the transfer recording medium 1. At the same time, heating resistors 2b, 2d, 2e, and 2f, for instance, of the thermal head 2 are heated. Among the image-forming elements 31 containing the colorant of yellow, those image-forming elements 31 provided with both heat and the light having the wavelength $\lambda$ (Y) (those portions provided with hatching in FIG. 2a; hardened image-forming elements are hereafter indicated by hatching) are hardened.

Figure 2A:
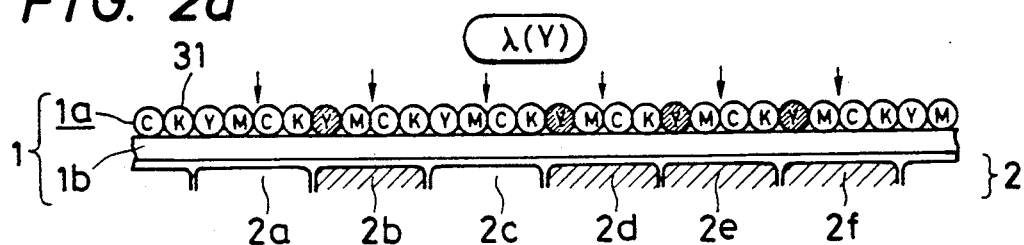
Figure 2B:
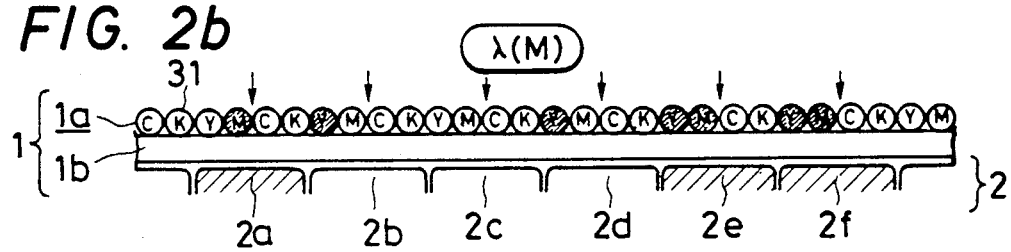
Figure 2C:
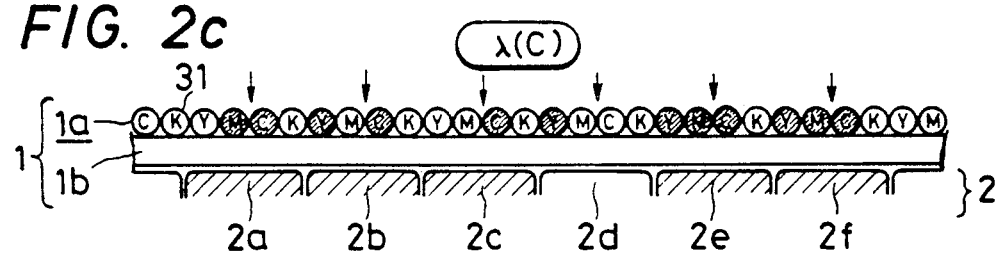
Figure 2D:
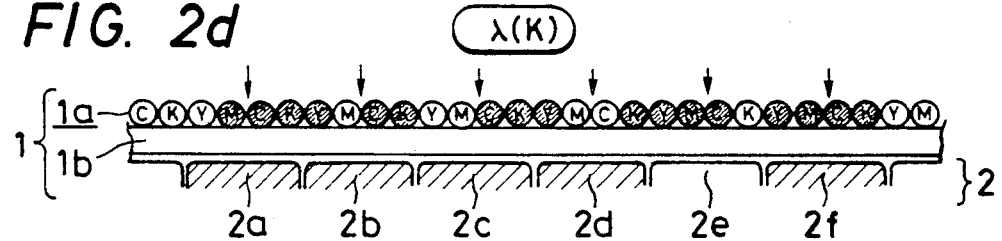
Figure 2E:
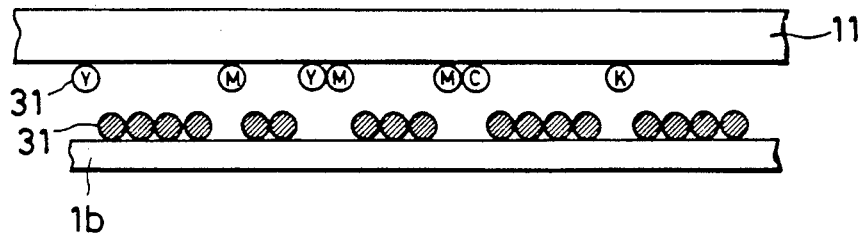

Next, as shown in FIG. 2b, if the light having the wavelength $\lambda$ (M) is applied to the transfer recording layer 1a, and the heating resistors 2a, 2e, and 2f are heated, among the image-forming elements 31 containing the colorant of magenta, those provided with heat and the light having the wavelength $\lambda$ (M) are hardened. Furthermore, as shown in FIGS. 2c and 2d, if light having the wavelength $\lambda$ (C) and light having the wavelength $\lambda$ (K) are applied and desired heating resistors are heated, image-forming elements 31 provided with light and heat are hardened. Ultimately, a transferred image (a latent image) is formed by means of image-forming elements 31 which did not harden. This transferred image is transferred onto recording paper 11 in the subsequent transfer process, as shown in FIG. 2e.

The transfer recording medium on which a transferred image has been formed is brought into contact with the recording medium in the transfer process and heating is effected from the side of the transfer recording medium or the recording medium to selectively transfer the transferred image onto the recording medium, thereby forming an image corresponding to the image information. Accordingly, the heating temperature at this time is determined in such a manner that the transferred image alone is selectively transferred with respect to the physical properties governing the transfer characteristics. In addition, it is effective to perform pressurization simultaneously so as to carry out the transfer efficiently. Pressurization is particularly effective when a recording medium having a low degree of surface smoothness is employed. In cases where the physical property governing the transfer characteristics is viscosity at room temperature, transfer can be effected by means of pressurization alone.

Incidentally, in the embodiment described in relation to FIGS. 2a to 2d, an image forming method has been shown in which the entire region of the thermal head 2 is irradiated with light, and heating resistors of the thermal head 2 are selectively driven to generate heat. However, it is also possible to form multi-color images by selectively effecting irradiation with light by uniformly heating certain portions of the transfer recording medium (in the case of the thermal head 2 shown in FIG. 2a, this is the case where the overall heating resistors are driven to generate heat). In other words, light energy, which has been modulated in accordance with recording signals and selected in accordance with the tone of image-forming elements whose physical properties governing the transfer characteristics are desirably changed, is applied together with heat energy.

Figure 3:
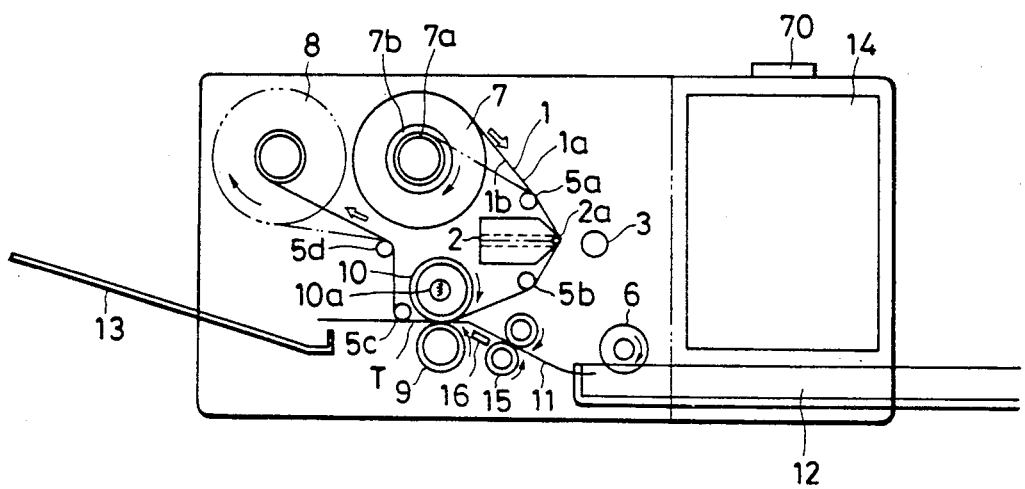
FIG. 3 is a schematic diagram of a single color image-forming apparatus.

Referring next to FIG. 3, description will be made of an example of a single color image-forming apparatus to which the embodiment of the present invention is applied. The transfer recording medium 1 used in the apparatus of this embodiment is arranged such that the image-forming elements 31 composed of components shown in Table 1 below are dispersed in a binder, and the mixture is provided on the substrate 1b constituted by a 6 μm-thick polyester film. The sensitizer in the image-forming elements absorbs light in the range of about 500–600 nm to initiate the reaction. Incidentally, condenser paper, glacyn paper, or the like is conceivable as the material of the substrate 1b, as well as the polyester film.

This sensitizer has a tint of magenta and causes color-mixing with phthalocyanine green as the colorant to provide a color of black at the time of image formation. An elongated transfer recording medium 1 thus prepared was wound up in the form of a roll and incorporated in the apparatus as a supply roll 7. In other words, this supply roll 7 is loaded on a rotatable shaft 7a. The tip of the transfer recording medium 1 is supplied from the supply roll 7, passes along a guide bar 5a, the thermal head 2, and a guide bar 5b and between a transfer roller 10 and a pressure roller 9, changes its direction by means of guide bars 5c, 5d, and reaches a takeup roll 8. Since its tip is retained at the roll 8, as the roll rotates, the transfer recording medium 1 is gradually taken up by the roll 8 around its peripheral surface. The takeup roll 8 is rotatively driven by a known means.

At that juncture, the transfer recording medium is conveyed by the transfer roller 10 in such a manner that a winding angle thereof with respect to the thermal head 2 will become fixed by means of the guide bars 5a, 5b. Namely, the guide bars 5a, 5b guide the transfer recording medium 1 in such a manner as to cause the same to come into contact with the thermal head 2 at a fixed angle. The thermal head 2 is provided on the side of the substrate 1b of the transfer recording medium 1. A plurality of the heating elements 2a are disposed on the tip thereof, and the heating of these heating elements is controlled in correspondence with image information. The supply roller 7 is provided with a fixed back tension by a hysteresis brake in such a manner that its value becomes 1.8–2.0 kgf. The substrate 1b of the transfer recording medium 1 comes into contact with the heating elements of the thermal head 2 with a fixed pressure by means of this tension.

Figure 4:
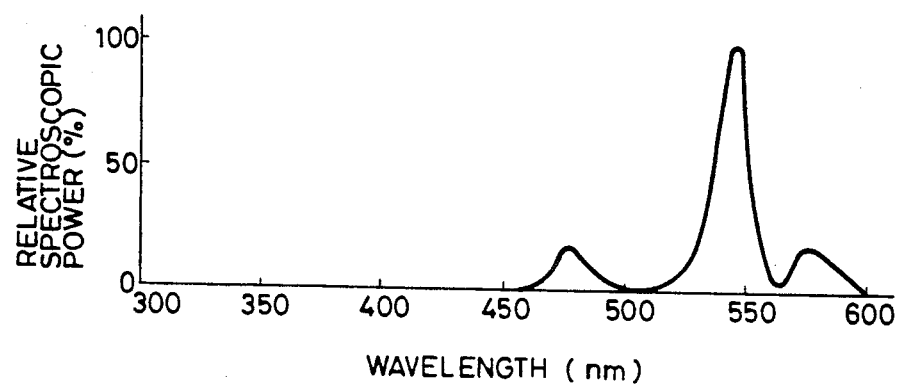
FIG. 4 is a diagram illustrating the spectroscopic characteristics of a light source used in a single color image-forming apparatus.

On the other hand, a fluorescent lamp 3 is disposed 2 cm apart from the recording layer 1a of the transfer recording medium 1 in an area of the apparatus on the side of the recording layer 1a of the transfer recording medium 1 opposing the thermal head 2 such as to place the transfer recording medium 1 therebetween. As for this fluorescent lamp 3, a high color rendering fluorescent lamp having the spectroscopic characteristics shown in the graph in FIG. 4 was used. As for a fluorescent substance, $Tb^{3+}$ activated $(La, Ce, Tb)_2O_3.0.2SiO_2.0.9P_2O_5$ was used. As other fluorescent substances, it is also possible to use $Tb^{3+}$ activated $(Ce, Tb)MgAl_{11}O_{19}$, $Y_2SiO_5$: Ce, Tb lamps. However, the aforementioned fluorescent substance was used in view of the practical efficiency and the life performance.

A transfer and fixing section T is composed of the transfer roller 10 and the pressure roller 9 disposed such

TABLE 1

| Item | Component | wt. % |
|---|---|---|
| Polymerizable prepolymer | Poly(4,4;-isopropylidene-diphenylene-1,1,3-trimethyl-3-phenylindane-5,4'-dicarboxylate: p,p'-dihydroxy-biphenyl azelate) (25:75) | 50 |
| Crosslinking agent | tri(6-acryloyloxyhexyl)-1,3,5-benzenetricarboxylate | 20 |
| Reaction initiator | di-tertiarybutylperoxyisophthalate | 6 |
| Sensitizer | (structural formula: benzothiazole derivative with =CH—CH= bridge, ethyl groups on N, C₂H₅) | 4 |
| Colorant | Phthalocyanine Green | 20 | as to oppose each other with the transfer recording medium 1 placed therebetween. As for this transfer roller 10, an aluminum roller of a 40 mm diameter with a 25 μm-thick Teflon coating was used. As for the pressure roller 9, an aluminum roller of a 30 mm diameter provided with a 5 mm-thick silicone rubber coating and further provided with a 30 μm-thick Teflon coating and having a hardness of 40° (JIS hardness A) was used. The transfer roller 10 and the pressure roller 9 were set such as to be pressure-contacted at about 35 g/mm$^2$ by a pressurizing means (not shown).

The transfer roller 10 is controlled by an incorporated heater 10a in such a manner that its surface temperature becomes approximately 110° C., so as to transfer, by means of heating and pressure contact, the transferred image onto the transfer recording medium 1 formed by the thermal head 2 and to fix the same. As for the recording medium, the recording paper 11 having a surface smoothness of about 10 seconds was used. This recording paper 11 is paid out from a cassette 12 by the rotation of a feed roller 6. The paper 11 paid out is temporarily blocked from advancing by means of a registration roller 15, and is then fed between the rollers 9 and 10 in synchronization with the transfer layer on the transfer recording medium 1. Incidentally, reference numeral 16 denotes a guide. Furthermore, a casing 14 accommodates the power source and the control circuit of this image-forming apparatus.

Figure 5:
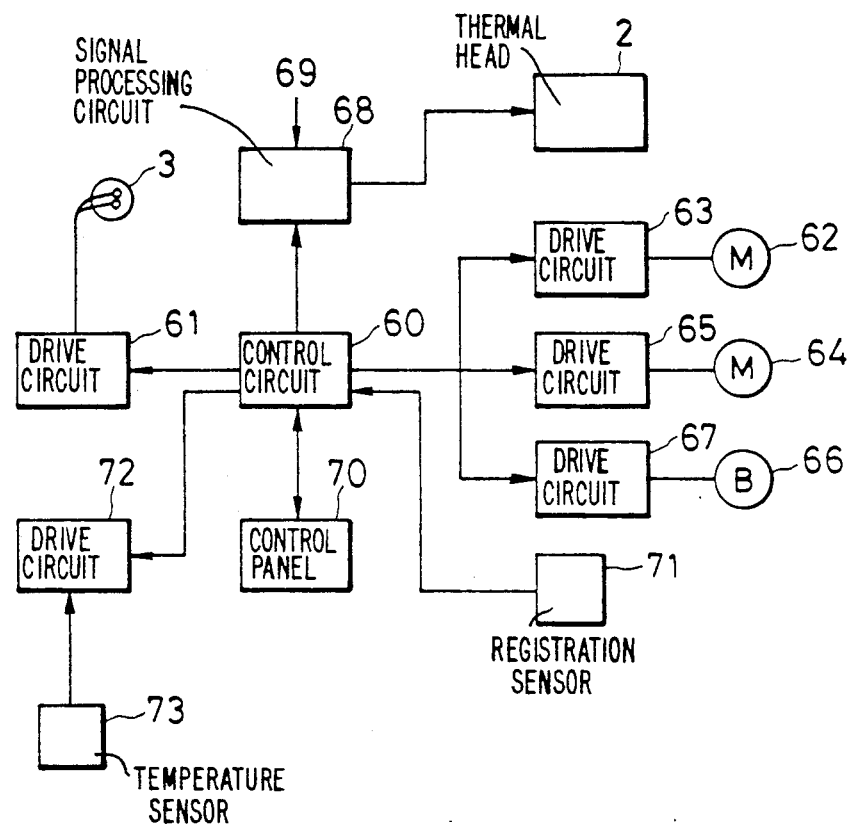
FIG. 5 is a block diagram of a control circuit of a single color image-forming apparatus.

FIG. 5 shows a schematic block diagram of the control circuit.

In FIG. 5, a sequence control circuit 60 sequentially controls the following: a drive circuit 61 for lighting the fluorescent lamp 3, a drive circuit 63 for urging a stepping motor for operating the feed roller 6, a drive circuit 65 for urging a stepping motor 64 to operate the transfer roller for conveying the transfer recording medium 1, a drive circuit 67 for urging a hysteresis brake 66 for imparting back tension to the transfer recording medium 1; a drive circuit 72 for urging a heater 100 up to a predetermined temperature in accordance with a signal from a temperature sensor 73 of the transfer roller 10, an image signal processing circuit 68 for processing image signal data to be supplied to the thermal head 2 upon receipt of an image signal 69 from the outside and for controlling a drive circuit for urging the heating elements of the thermal head 2, and an indicator on a control panel 70.

Description will now be made of the operation of the above-described apparatus in accordance with this embodiment.

First, recording is commenced by turning ON a switch (not shown) of the control panel 70 of this apparatus. On receipt of a drive signal from the control panel 70, the sequence control circuit 60 activates the drive circuit 63 to drive the stepping motor 62. The roller 6 thereby starts to rotate, feeds out one sheet of the recording paper 11 from the cassette 12, and continues feeding the same until the tip of the recording paper reaches a registration sensor (not shown) (disposed in the vicinity of a pressure contacting portion of the registration roller 15). When the registration sensor 71 detects the recording paper 11, the hysteresis brake 66 (not shown) and the transfer roller 10 operate at a predetermined timing, with the result that the transfer recording medium 1 is conveyed and the respective heating elements 2a of the thermal head 2 are energized. While the thermal head 2 is being urged, at least the fluorescent lamp 3 is lit. In other words, because of the above-described arrangement, heat from the thermal head 2 is imparted to the recording layer 1a via the substrate 1b, while light from the fluorescent lamp 3 is applied directly to the recording layer 1a. Consequently, a transferred image corresponding with image signals for each line is formed sequentially on the transfer recording medium 1 thus conveyed. The transferred image thus formed on the transfer recording medium 1 is conveyed to the pressure contacting portion T constituted by the transfer roller 10 and the pressure roller 9. At the same time, however, the recording paper 11 is also conveyed to the pressure contacting section simultaneously with the transferred image by means of the registration roller 15 which rotates in synchronization, as described before, and the transferred image is transferred onto the recording paper 11 by means of a pressure-contacting force acting between the rollers 9 and 10. The recording paper for which the transfer has been completed is discharged onto a paper discharging tray 13.

It should be noted that in the case of a mark signal (black), energization of the thermal head 1 is not carried out, and energization is effected and heating is conducted when the signal is not a mark signal (white). In other words, energization energy for effecting negative recording was set to 0.8 W/dot×2.0 m.sec.

Figure 6:
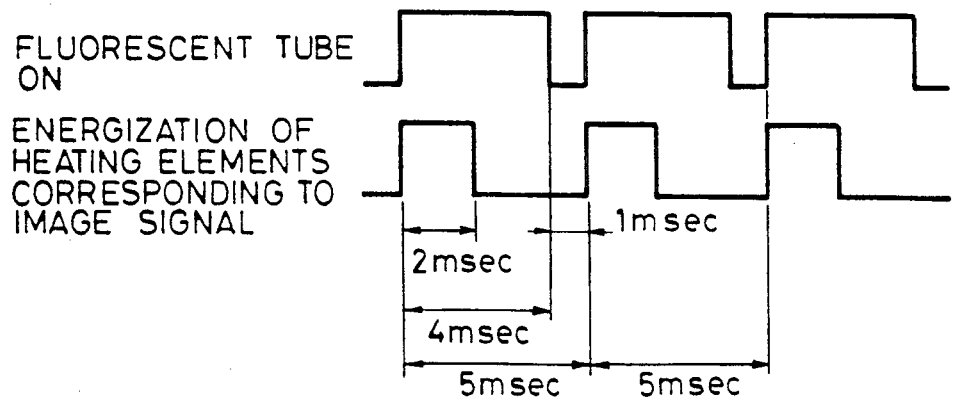
FIG. 6 is a timing chart for applying light and heat energy by a single color image-forming apparatus.

Furthermore, a chart showing driving timing in accordance with this embodiment is shown in FIG. 6.

First, the heating resistors corresponding to image signals representing black are not energized, and those corresponding to image signals representing white are energized for 2 m.sec. and, at the same time, are irradiated uniformly with light from the high color rendering fluorescent lamp 3. This irradiation time is set to 4 m.sec. from the start of energization of the heating resistors. After a lapse of 1 m.sec. upon completion of the irradiation, i.e., after a lapse of 5 m.sec. from the start of energization, recording of the next line is similarly carried out. The transferred image is formed by consecutively repeating these operations.

The images obtained on the recording paper by the image-forming apparatus described above are very clear, and high-quality images with good fixing characteristics can be obtained.

Description will now be made of an embodiment in which the image-forming method employed in the present invention is applied to a multi-color image-forming apparatus.

It is possible to effect multi-color recording by using the transfer recording medium in which the image-forming elements 31, which are respectively sensitive to four different kinds of wavelength and form different tones, i.e., yellow, magenta, cyan, and black, as already described with reference to FIGS. 2a to 2d, are disposed on the substrate 1b. As for such transfer recording medium 1, one in which the image-forming elements 31 shown in Tables 2-4 are dispersed in a binder, and the mixture is disposed on the substrate 1b constituted by a 6 μm-thick polyester film was used. The reaction initiators in the image-forming elements shown in Tables 2-5 absorb light in the ranges of about 340-380 nm, about 380-450 nm, and about 450-600 nm, respectively, to start the reaction. The colors at the time of image formation are cyan, yellow, and magenta in that order.

TABLE 2

| Item | Component | wt. % |
| --- | --- | --- |
| Polymerizing component | Polyvinyl cinnamate | 70 |
| Sensitizer | anthraquinone | 20 |
| Colorant | carbon black | 10 |

TABLE 3

| Item | Component | wt. % |
| --- | --- | --- |
| Polymerizable prepolymer | Poly(4,4;-isopropylidene-diphenylene-1,1,3-trimethyl-3-phenylindane-5,4'-dicarboxylate: p,p'-dihydroxybiphenyl azelate) (25:75) | 50 |
| Crosslinking agent | tri(6-acryloyloxyhexyl)-1,3,5-benzenetricarboxylate | 20 |
| Reaction initiator | benzophenone + Michler's ketone | 10 |
| Colorant | phthalocyanine blue | 20 |

Figure 7:
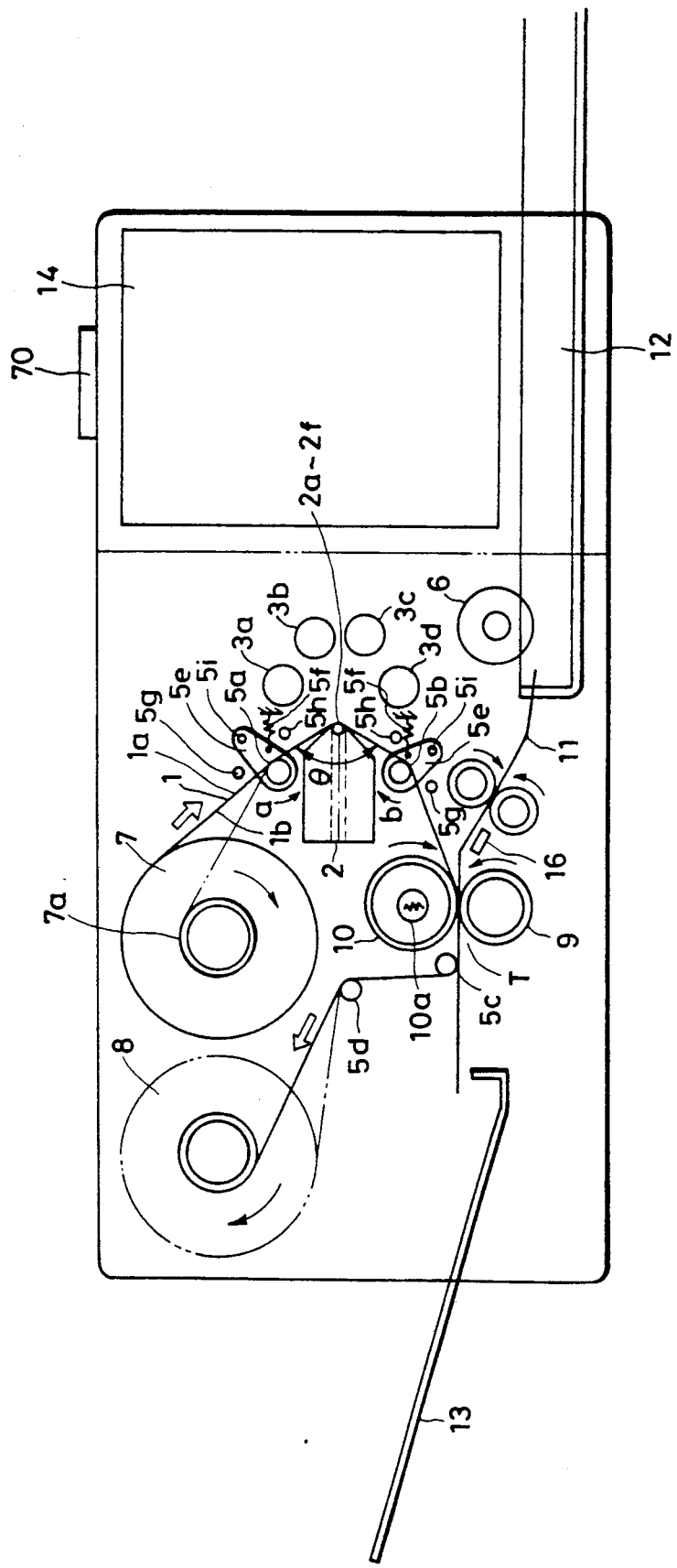
FIG. 7 is a schematic diagram of a multi-color image-forming apparatus.

An apparatus for obtaining multi-color images using this transfer recording medium 1 is shown in FIG. 7.

The point which differs from the single color image-forming apparatus shown in FIG. 3 is that four light sources 3a, 3b, 3c, and 3d having different wavelengths are disposed.

A high color rendering fluorescent lamp 3a, a diazo copying machine-use fluorescent lamp 3b, and a black light 3c are used as the fluorescent lamps. In particular, a sharp cut filter-L-38 and another sharp cut filter-1A were disposed in front of the diazo copying machine-use fluorescent lamp 3b and the black light 3c, respectively so as to obtain desired spectroscopic characteristics corresponding to the image-forming elements.

TABLE 4

| Item | Component | wt. % |
| --- | --- | --- |
| Polymerizable prepolymer | Poly(4,4;-isopropylidene-diphenylene-1,1,3-trimethyl-3-phenylindane-5,4'-dicarboxylate: p,p'-dihydroxybiphenyl azelate) (25:75) | 50 |
| Crosslinking agent | tri(6-acryloyloxyhexyl)-1,3,5-benzenetricarboxylate | 20 |
| Reaction initiator | benzoin | 10 |
| Colorant | Benzidine Yellow | 20 |

TABLE 5

| Item | Component | wt. % |
| --- | --- | --- |
| Polymerizable prepolymer | Poly(4,4;-isopropylidene-diphenylene-1,1,3-trimethyl-3-phenylindane-5,4'-dicarboxylate:p,p'-dihydroxybipheyl azelate) (25:75) | 50 |
| Crosslinking agent | tri(6-acryloyloxyhexyl)-1,3,5-benzenetricarboxylate | 20 |
| Reaction initiator | di-ti-butylperoxy isophthalate | 10 |
| Sensitizer | (structure shown: $H_5C_2OOC$ and $H_3C$ groups attached via C=C to thiazole ring, linked by =CH—CH= to another heterocycle with O, N-$CH_2COOK$, =S) | 10 |
| Colorant | Brilliant Carmine 6B | 10 |

Incidentally, the guide rollers 5a, 5b in this embodiment are swingable unlike those of the embodiment shown in FIG. 3. In other words, as shown in FIG. 7, two arms 5e are respectively swingable with shafts 5i as their rotational centers, and the guide rollers 5a, 5b are respectively disposed on the arms 5e, and are swingable with the shafts 5i as their rotational centers. Two springs 5f provide forces to the arms 5e by a fixed tension in the directions of the arrows a, b, respectively. Stoppers 5g, 5h are provided to restrict the rotational angles of the arms 5e.

By virtue of the above-described arrangement, the guide rollers 5a, 5b are located at positions where the tension provided to the transfer recording medium 1 and the force exerted by the spring 5f are balanced. As the tension of the transfer recording medium 1 fluctuates, the guide rollers 5a, 5b are swingable within the range of fixed angles which are restricted by the stoppers 5g, 5h. Consequently, the transfer recording medium 1 is guided by the guide rollers 5a, 5d in such a manner as to abut against the thermal head 2 within a fixed angle (for instance, about 45° C.<θ<180° C. in this embodiment).

Figure 8:
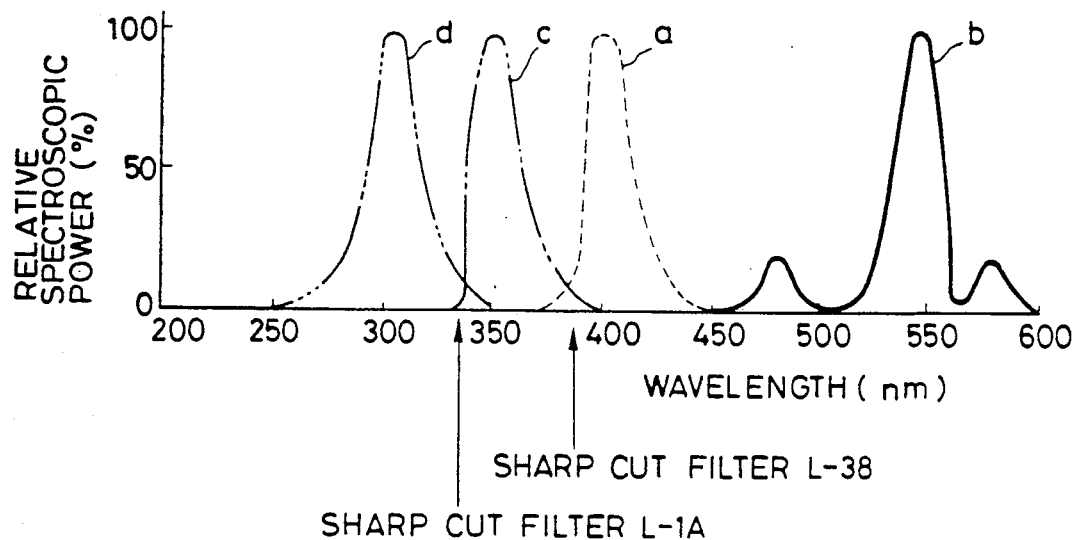
FIG. 8 is a diagram illustrating the spectroscopic characteristics of a light source used in a multi-color image-forming apparatus.

FIG. 8 shows the spectroscopic characteristics of the fluorescent lamps in this embodiment.

Figure 9:
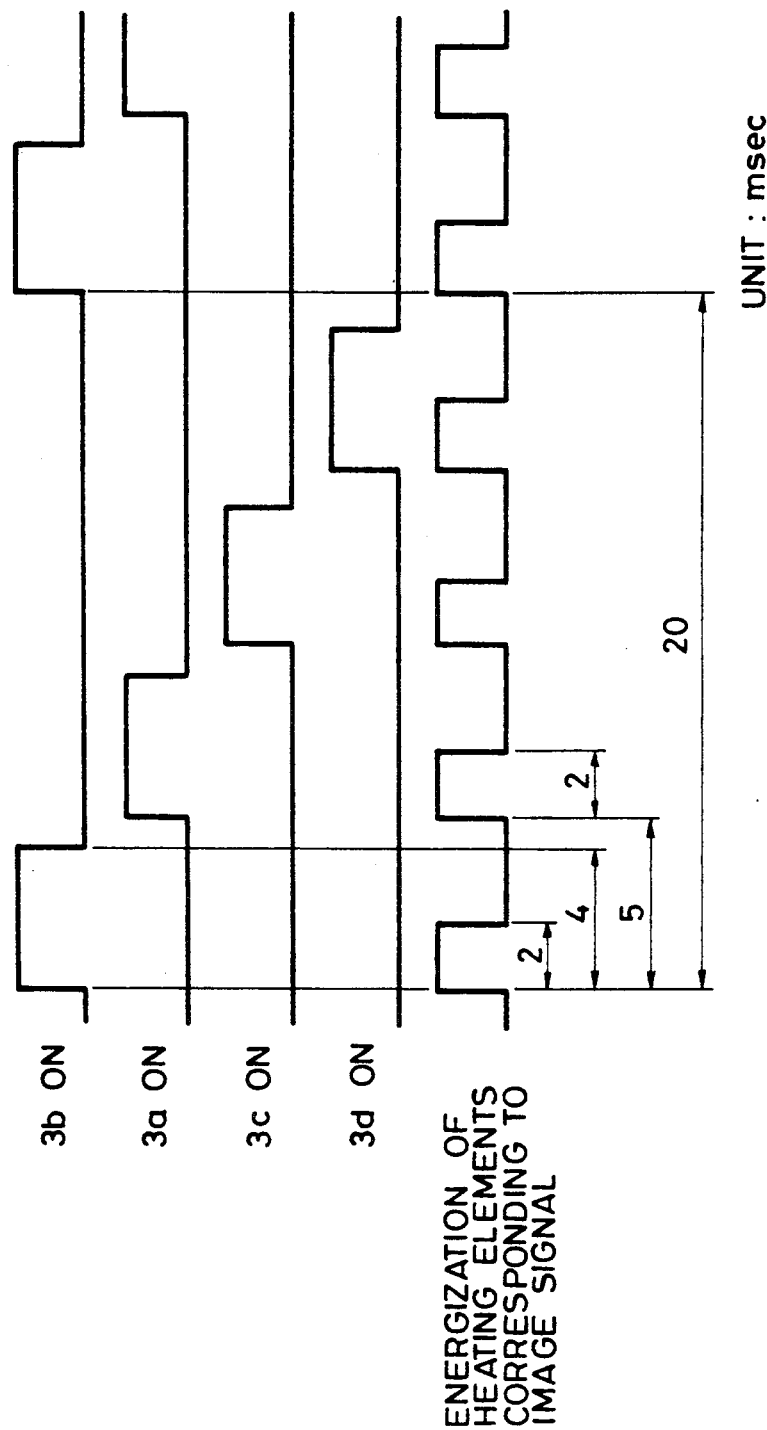
FIG. 9 is a timing chart for imparting light and heat energy by a multi-color image-forming apparatus.

Description will now be made of a process for obtaining color images in response to image signals corresponding to yellow, magenta, cyan, and black in accordance with a chart showing the recording timing of the multi-color image-forming apparatus, shown in FIG. 9, in accordance with this embodiment.

First, heating resistors corresponding to the signals representing white are energized for 2 m.sec. without energizing the heating resistors corresponding to image signals representing yellow and, at the same time, are uniformly applied with the light of the diazo copying machine-use fluorescent lamp 3b. The irradiation time is set at 4 m.sec. After a lapse of 1 m.sec. upon completion of the irradiation, heating resistors corresponding to the image signals representing white are energized for 2 m.sec. without energizing the heating resistors corresponding to image signals representing magenta, and, at the same time, are uniformly irradiated with the light of the high color rendering green florescent lamp 3a. The irradiation time is 4 m.sec. as with yellow. Similarly, the formation of a latent image of all the four colors is completed by applying the light of the black light 3c in the case of cyan and the light of the health ray lamp 3d in the case of black. Accordingly, it takes 15 m.sec. to form one line of an image.

By repeating the above-described process for each line, it is possible to obtain a full-color image on the recording paper.

Incidentally, the set conditions for components other than the light sources are the same as those in the embodiment for single-color recording, and the conveyance of the recording paper 11 and the transfer recording medium 1 is the same as that for the above-described embodiment for single-color recording.

Full-color images thus obtained on the recording paper are free of color drift, have a high saturation, and are clear high-quality images with good fixing properties.

Figure 11:
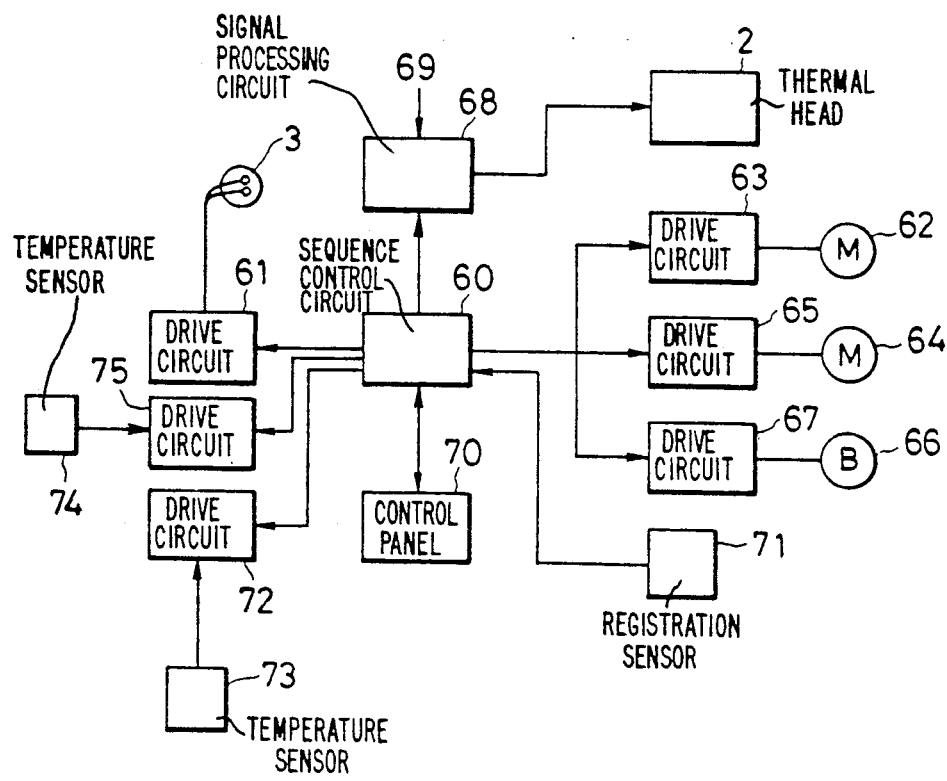
FIG. 11 is a block diagram of a control circuit of the apparatus shown in FIG. 10.
Figure 10:
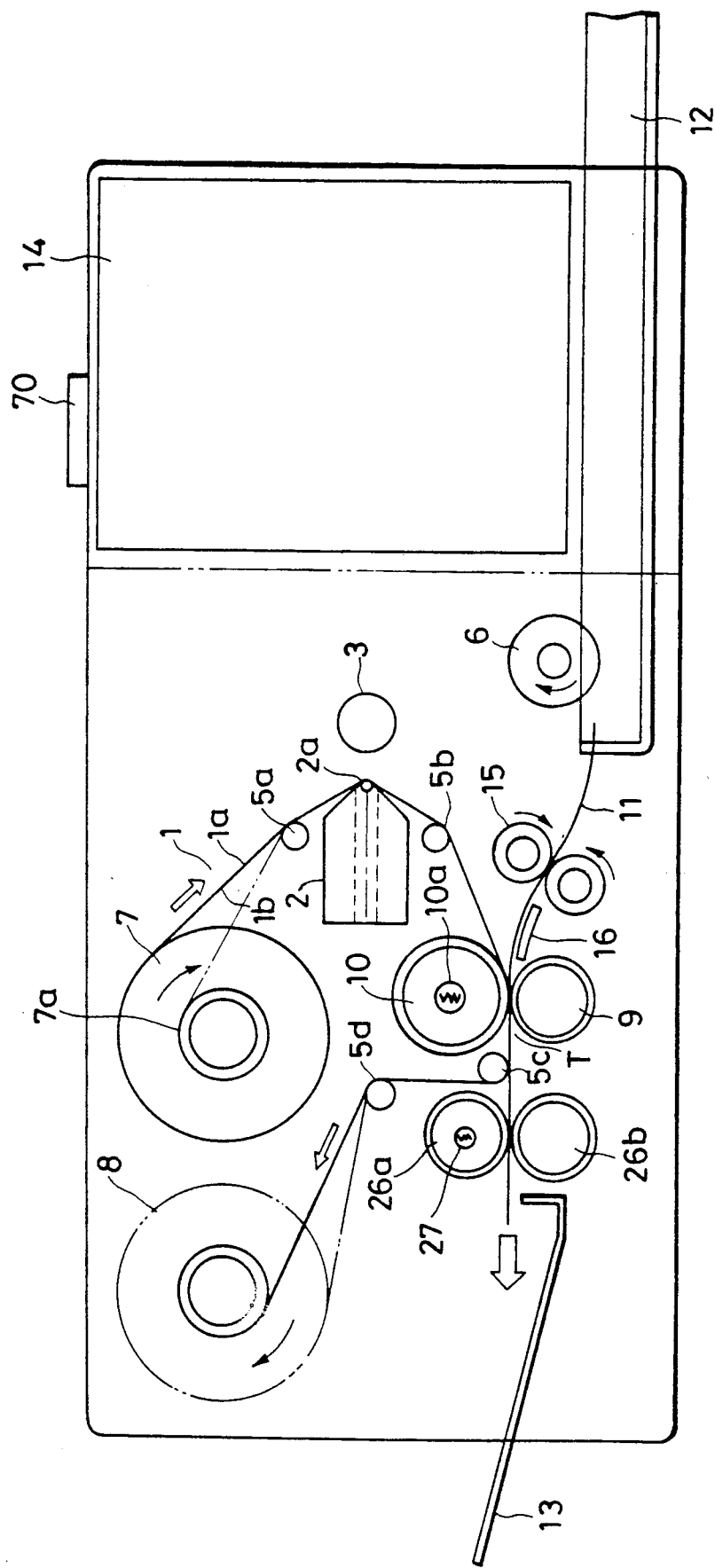
FIG. 10 is a schematic diagram of a single color image-forming apparatus in accordance with another embodiment of the present invention.
Figure 12:
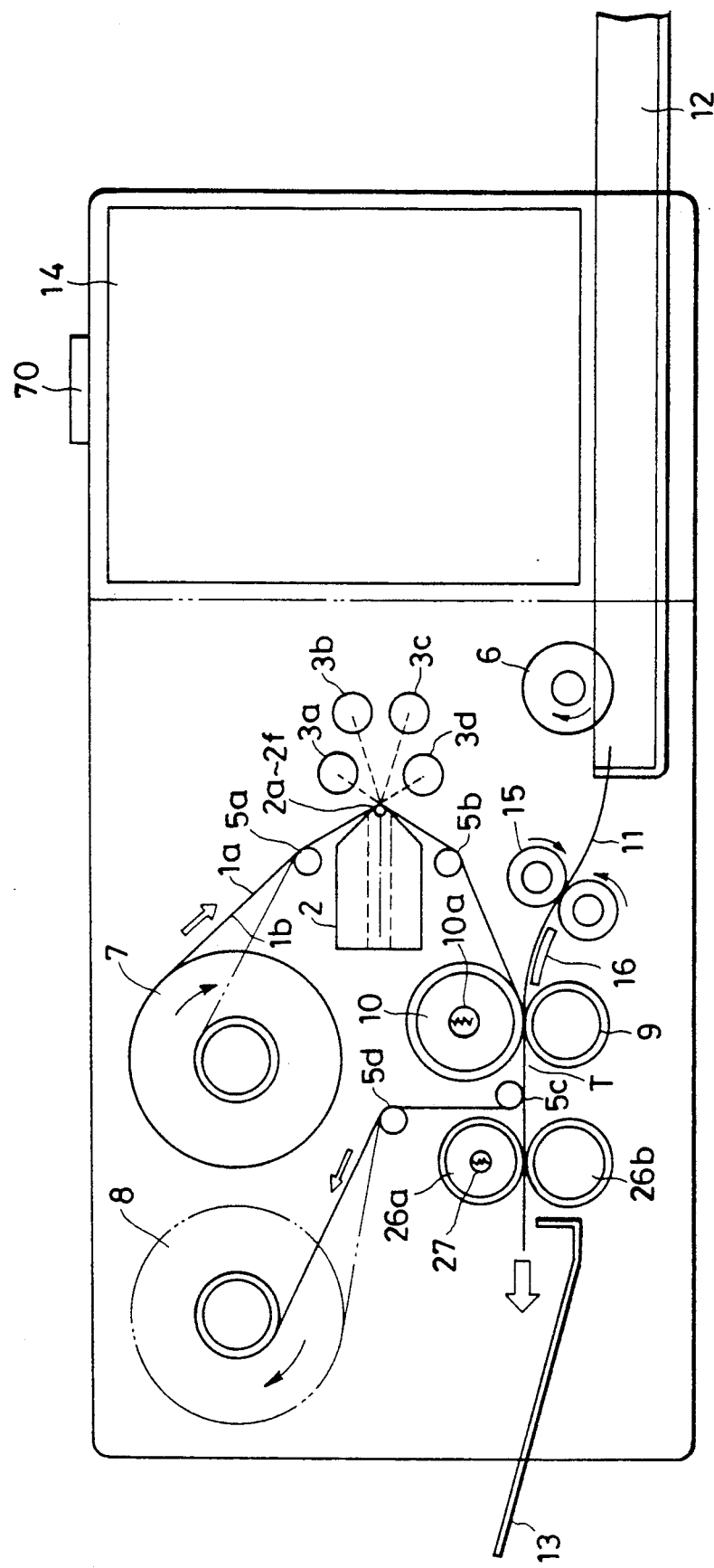
FIG. 12 is a schematic diagram of a multi-color image-forming apparatus in accordance with a further embodiment of the present invention.

Referring next to FIGS. 10 to 12, description will be made of another embodiment.

In the embodiments shown next, a fixing means is further provided to the apparatus of the aforementioned embodiments. As mentioned above, if a tansferred image is transferred onto the paper 11, the image is fixed on the paper 11. However, it is estimated that the fixing capability may be weak depending on, for instance, the material of the transfer recording layer, the kind of the recording medium, an ambient environment (including the temperature and humidity), and so forth.

For this reason, the fixing means is provided as shown in FIG. 10 (i.e., a recording apparatus in which the fixing means is added to the one shown in FIG. 3) or in FIG. 12 (i.e., a recording apparatus in which the fixing means is added to the one shown in FIG. 7). In these embodiments, a fixing roller 26a and a pressure roller 26b are provided as the fixing means downstream of the transfer section T (in terms of the conveying direction of the paper 11) along the conveying route of the recording paper separated from the transfer recording medium 1. Here, the fixing roller 26a is a 25 mm-diameter roller in which a 25 μm-thick Teflon coating is provided on an aluminum alloy roller. Its surface temperature is controlled by a 500 W halogen heater 27 in such a manner as to become 150° C.±3° C. The fixing roller 26a is pressed by the pressure roller 26b formed by providing a 30 μm-thick Teflon coating on silicone rubber of hardness 35° (JIS hardness), said pressure roller 26 being urged by a pressurizing means (not shown) in such a manner that the pressure will become 20 g/mm$^2$.

FIG. 11 shows a schematic block diagram of the control circuit of the recording apparatus shown in FIG. 10.

In the drawing, a sequence control circuit 60 sequentially controls the following: a drive circuit 61 for lighting the fluorescent lamp 3, a drive circuit 63 for urging a stepping motor for operating the feed roller 6, a drive circuit 65 for urging a stepping motor 64 to operate the transfer roller for conveying the transfer recording medium 1, a drive circuit 67 for urging a hysteresis brake 66 for imparting back tension to the transfer recording medium 1; a drive circuit 72 for urging a heater 10a up to a predetermined temperature in accordance with a signal from a temperature sensor 73 of the transfer roller 10, a driving circuit 75 for urging the heater 27 within the given temperature range by means of a signal from a temperature sensor 74 of the fixing roller 26a, an image signal processing circuit 68 for processing image signal data to be supplied to the thermal head 2 upon receipt of an image signal 69 from the outside and for controlling a drive circuit for urging the heating elements of the thermal head 2, and an indicator on a control panel 70.

Description will now be made of the operation of the above-described apparatus in accordance with this embodiment.

First, recording is commenced by turning ON a switch (not shown) of the control panel 70 of this apparatus. On receipt of a drive signal from the control panel 70, the sequence control circuit 60 activates the drive circuit 63 to drive the stepping motor 62. The roller 6 thereby starts to rotate, feeds out one sheet of the recording paper 11 from the cassette 12, and continues feeding the same until the tip of the recording paper reaches a registration sensor (not shown) (disposed in the vicinity of a pressure contacting portion of the registration roller 15). When the registration sensor 71 detects the recording paper 11, the hysteresis brake 66 (not shown), the transfer roller 10, and the fixing roller 26a operate at a predetermined timing, with the result that the transfer recording medium 1 is conveyed and the respective heating elements 2a of the thermal head 2 are urged. While the thermal head 2 is being urged, at least the fluorescent lamp 3 is lit. In other words, because of the above-described arrangement, light from the fluorescent lamp 3 is imparted directly to the recording layer 1a, while heat from the thermal head 2 is applied to the recording layer 1a as it is conducted via the substrate 1b. Consequently, a transferred image corresponding with image signals for each line is formed sequentially on the transfer recording medium 1 thus conveyed. The transferred image thus formed on the transfer recording medium 1 is conveyed to the pressure contacting portion T constituted by the transfer roller 10 and the pressure roller 9. At the same time, however, the recording paper 11 is also conveyed to the pressure contacting section simultaneously with the transferred image by means of the registration roller 15 which rotates in synchronization, as described before, and the transferred image is transferred onto the recording paper 11 by means of a pressure-contacting force acting between the rollers 9 and 10.

At that juncture, a transferred image is subjected to a fixing operation by heat and pressure which they receive at the time of being transferred onto the paper 11. Even if the fixing capability is weak owing to, for instance, the quality of the material of the transfer recording medium, the kind of the recording medium, or the ambient environment, the transferred image is fixed completely since it is conveyed to the pressure-contacting section F constituted by the fixing roller 26a and the pressure roller 26b, and is then subjected to a supplementary fixing operation by heat and pressure. Subsequently, the recording paper for which the transfer has been completed is discharged to the paper discharging tray 13.

Incidentally, although, in the respective embodiments described above, an example has been shown in which heat and pressure are used as energy for effecting the supplementary fixing operation has been shown, depending on the quality of the material of the transfer recording layer or the like, for instance, light alone may be used, or either of the heat and pressure, or a combination of the same may be used.

In addition, in the case of the full-color recording apparatus shown in FIG. 12, images are also fixed completely in a similar manner.

Other embodiments will now be described with reference to FIGS. 13 to 19.

In the embodiment which will be described next, the image recording apparatus is provided with a means for imparting tension to the transfer recording medium in the opposite direction of the conveying direction as well as a means for holding the transfer recording medium with good accuracy at a fixed angle with respect to the recording head.

In accordance with the above-described embodiment, if the apparatus is operated with the transfer recording medium and the recording medium installed therein, the transfer recording medium being conveyed is applied back tension and is thereby brought into contact with the recording head under a constant pressure at a predetermined angle. Accordingly, it becomes possible to apply heat or light energy positively from one side of the transfer recording medium without providing a platen or the like, and to apply light or heat energy efficiently from the other side of the transfer recording medium.

Figure 13:
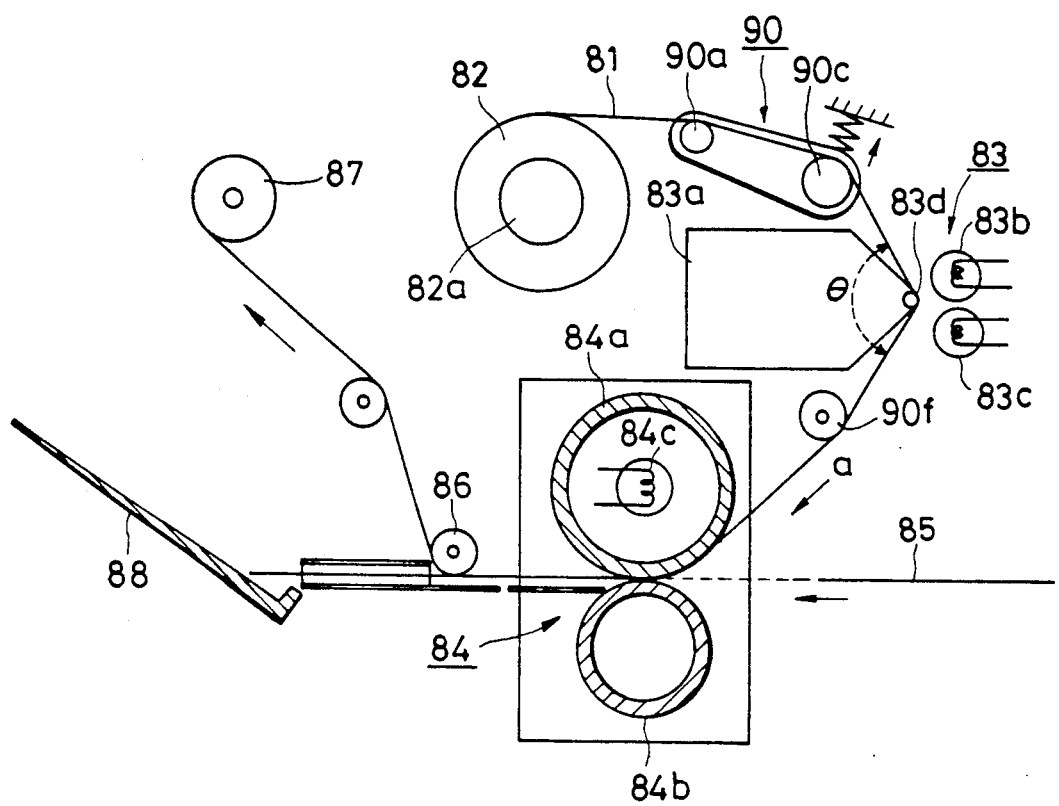
FIG. 13 is a schematic diagram illustrating the construction of an image recording apparatus in accordance with yet another embodiment of the present invention.

FIG. 13 is a schematic diagram illustrating the construction of the image recording apparatus in accordance with another embodiment of the invention. In the drawing, a sheet-like transfer recording medium 81 is loaded as a supply roll 82 wound up in the form of a roll. The transfer recording medium 81 is conveyed from the supply roll 82 in the direction of an arrow a by means of a heat roller rotatively driven by a motor (neither are shown). A latent image is formed on the transfer recording medium 81 by a recording section 83, and the latent image is transferred onto a recording medium 85 in a transfer section 84. After the transfer, the transfer recording medium 81 and the recording medium 85 are then separated by a separation roller 86, and the transfer recording medium 81 is taken up by a takeup roll 87. Subsequently, the recording medium 85 is discharged onto a discharge tray 88.

A shaft 82a of the supply roll 82 is provided with a means 89 for providing tension (hereafter referred to as the "tension means") to the transfer recording medium 81, which will be described below, in the opposite direction of the conveying direction, i.e., back tension. In addition, a means 90 for allowing the transfer recording medium 81 being conveyed to maintain a predetermined angle (hereafter referred to as the "angle maintaining means") with respect to the recording section 83 is provided on the upstream side of the transfer recording medium 81 being conveyed using the recording section 83 as a reference.

Figure 14:
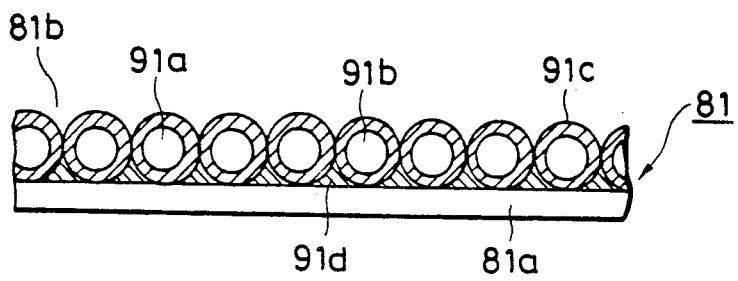
FIG. 14 is a diagram explaining the arrangement of a transfer recording medium.

A detailed description will now be made of the arrangement of the aforementioned respective parts. First, the transfer recording medium is arranged such that an ink layer 81b, which has properties capable of forming a latent image in cases where heat and light energy is simultaneously applied thereto, is adhered to a sheet-like substrate, as shown in FIG. 14. To cite an example of such ink, as shown in FIG. 14, the ink layer 81b is constituted by microcapsule-like image-forming elements formed by the following method using the components shown in Tables 6 and 7 as core portions 91a, 91b. In other words, 10 g of components shown in FIGS. 6 and 7 are mixed with paraffin oil, and this mixture is mixed with 1 g of gelatine and a cationic or nonionic surface active agent having an HLB value of at least 10 or above, 1 g of gum arabic, and 200 ml of water. This mixture is agitated by a homo-mixer at a speed of 8000–10,000 r.p.m. Subsequently, $NH_4OH$ (ammonium) is added to set the pH to 11 or above, and a microcapsule slurry is thereby obtained. The microcapsule slurry is then separated into a solid and a liquid using a Nutsche funnel. The solid is then dried by a vacuum cleaner for 10 hours at 35° C., thereby obtaining microcapsule-like image-forming elements. These image-forming elements are microcapsules in which the components of Tables 6 and 7 mixed with paraffin oil are respectively covered with shells 11c composed of gelatine and gum arabic, and are formed into a particle size of 7–15 μm and an average particle size of 10 μm.

The image-forming elements thus formed are adhered on the substrate 81a constituted by a 6 μm-thick polyethylene phthalate film, using an adhesive material 91d constituted by polyester resin and the like, thereby forming the ink layer 81b. Thus the transfer recording medium 81 is arranged.

TABLE 6

| Item | Component | wt. % |
| --- | --- | --- |
| Polymerizable prepolymer | Poly(4,4;-isopropylidene-diphenylene-1,1,3-trimethyl-3-phenylindane-5,4'-dicarboxylate:p,p'-dihydroxybiphenyl azelate) (25:75) | 50 |
| Crosslinking agent | tri(6-acryloyloxyhexyl)-1,3,5-benzenetricarboxylate | 20 |
| Reaction initiator | di-tertiarybutylperoxyisophthalate | 6 |
| Sensitizer | [benzothiazole]–CH=CH–[phenyl]–N(CH$_3$)$_2$ | 4 |
| Colorant | Brilliant Carmine 6B | 20 |

The sensitizer shown in Table 6 absorbs light in the range of about 350–400 nm to initiate the reaction. The sensitizer is yellowish and causes color-mixing with Brilliant Carmine 6b as the colorant to provide a color of red at the time or image formation.

Meanwhile, the sensitizer shown in Table 7 absorbs light in the range of about 500–600 nm to initiate the reaction. The sensitizer has a tint of magenta and causes color-mixing with Phthalocyanine Green as the colorant to provide a color of black at the time of image formation.

TABLE 7

| Item | Component | wt. % |
| --- | --- | --- |
| Polymerizable prepolymer | Poly(4,4;-isopropylidene-diphenylene-1,1,3-trimethyl-3-phenylindane-5,4'-dicarboxylate: p,p'-dihydroxybiphenyl azelate) (25:75) | 50 |
| Crosslinking agent | tri(6-acryloyloxyhexyl)-1,3,5-benzenetricarboxylate | 20 |
| Reaction initiator | di-tertiarybutylperoxyiso-phthalate | 6 |

TABLE 7-continued

| Item | Component | wt. % |
|---|---|---|
| Sensitizer | (benzothiazole)=CH—CH=(thiazolidinone)=S with N-C₂H₅ groups | 4 |
| Colorant | Phthalocyanine Green | 20 |

Figure 15:
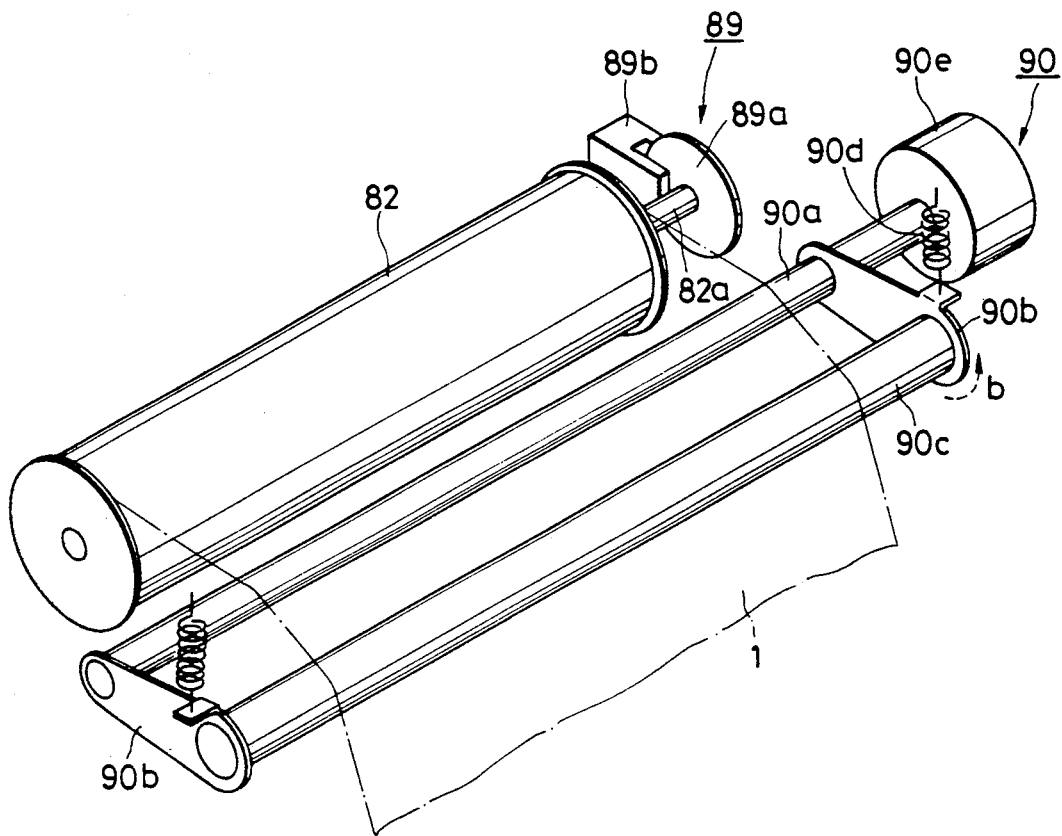
FIG. 15 is a diagram explaining the arrangement of a tension-adding means and an angle-maintaining means.

Next, description will be made of the tension means 89 and the angle maintaining means 90. As shown in FIG. 15, a 3 mm-thick aluminum disc 89a is secured to a shaft 82a of the supply roll 82. The disc 89a is provided with a brake coil 89b for providing a magnetic field in the direction of its thickness.

A guide bar 90a is rotatably provided on the downstream side of the supply roll 82. To the guide bar 90a is secured an arm 90b. A tension bar 90c is provided at the tip of the arm 90b. The tension bar 90c is pulled upwardly by a spring 90d and is pressed against the substrate 81a of the transfer recording material by a constant force. Furthermore, the guide bar 90a is provided with a potentiometer 90e to convert the rotational angle of the rotating guide bar 90a into electric signals. The electric signals of the potentiometer 90e are used to control an electric current flowing to the brake coil 89b so as to provide a constant brake to the rotation of the shaft 82a, so that back tension will be imparted to the transfer recording medium 81 being paid out and that the tension bar 90c will constantly assume a fixed position. Incidentally, as the position of the tension bar 90c becomes fixed, as described above, an angle $\theta$ (i.e., an angle of contact with a heating head 83d) of the transfer recording medium 81 which is guided by the tension bar 90c, a recording section 83, and a guide bar 90f disposed downstream of the recording section 83 becomes fixed with a good accuracy.

Figure 16:
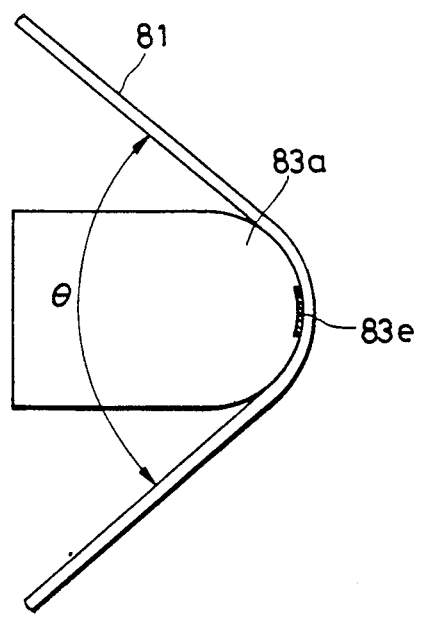
FIG. 16 is a diagram illustrating contact between a recording head and a transfer recording medium.

As shown in FIG. 16, the recording section 83 has a recording head 83a provided with the arc-shaped heating surface 83d which comes into contact with the substrate 81a of the transfer recording medium 81. An array of 8-dot/mm, A-4 size (209 mm × 297 mm) heating elements of the line type each having a width of 0.2 mm are arranged on the surface of an apex portion 83d of the recording head 83a. Since the transfer recording medium 81 is provided with back tension by the braking operation of the supply roll 82, as described earlier, the transfer recording medium 81 is brought into pressure contact with the heating surface 83d of the recording head 83a with a fixed predetermined pressure.

Figure 17:
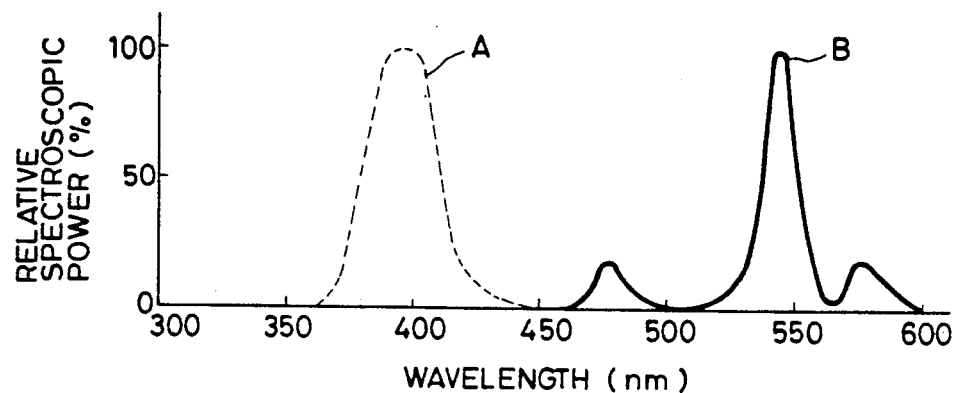
FIG. 17 is an explanatory graph illustrating the characteristics of a light source.
Figure 18:
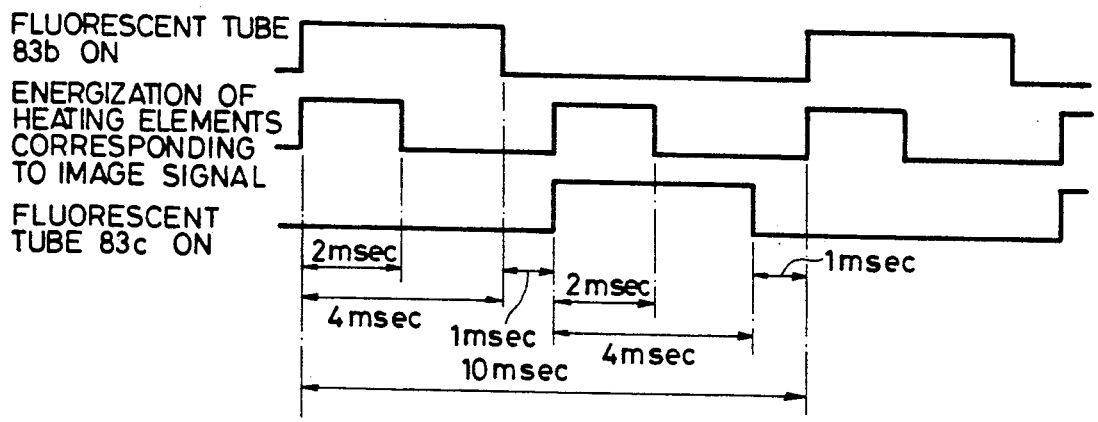
FIG. 18 is a chart showing the timing for applying heat and light.

Meanwhile, two 40-watt fluorescent lamps 93b, 83c having the spectroscopic characteristics as shown in FIG. 17 are disposed at positions opposing the recording head 83a such as to be about 2 cm apart from the transfer recording medium 81. A diazo copying machine-use fluorescent lamp is used as one fluorescent lamp 83b having the spectroscopic characteristics shown by A in FIG. 17. As a fluorescent substance, $Eu^{2+}$ activated $(SrMg)_2P_2O_7$ is used. Although it is also possible to use $Eu^{2+}$ activated $Sr_3(PO_4)_2$, $Sr_2P_2O_7$, and the like as alternative fluorescent substances, an optimum fluorescent substance suitable to the wavelength characteristics of the sensitizer may be used by selecting from those just mentioned above.

As for the other fluorescent lamp 83c having the spectroscopic characteristics shown by B in FIG. 17, a high color rendering green fluorescent lamp is used. As for a fluorescent substance, $Tb^{3+}$ activated (La, Ce, Tb)$_2$ O$_3$, 0.2SiO$_2$, 0.9P$_2$O$_5$ were used. As other fluorescent substances, it is also possible to use $Tb^{3+}$ activated (Ce, Tb)MgAl$_{10}$O$_{19}$, Y$_2$SiO$_5$: Ce, Tb, and the like. However, the aforementioned fluorescent substance was used in view of the practical efficiency and the life performance.

A transfer section 84 is disposed on the downstream side of the recording section 83 and is constituted by a heat roller 84a rotatively driven by a stepping motor (not shown) and a pinch roller 84b pressure-contacting with the heat roller 84a. The heat roller 84a has a built-in 300 W heater 84c and is constituted by an aluminum roller with its surface coated with 2 mm-thick silicone rubber. Its surface is so arranged that its temperature will be maintained in the range of 90°-100° C. by the heater 84c. Meanwhile, the pinch roller 84c is composed of silicone rubber having a hardness of 50 degrees. The pressing force of the two rollers is set to 1-1.5 kgf/cm$^2$.

Description will now be made of operation in cases where recording is effected using the recording apparatus constructed as described above.

An image is formed if the motor is driven to pay out the transfer recording medium 81 from the supply roll 82, and if, in the recording section 2, light and heat are applied to the ink layer 81b of the transfer recording medium 81 in correspondence with image signals. In other words, the ink layer 81b has a characteristic that, if a light beam of a predetermined wavelength and heat are applied thereto, its glass transition point rises, so that an image fails to be transferred to a recording medium 85. Therefore, as shown in the timing chart of FIG. 18, at the time of red color recording, the heating resistors corresponding to image signals representing red are not energized, and those corresponding to image signals representing white (the recording medium 85 is assumed to be white) are energized for 2 m.sec. At the same time, those portions are uniformly irradiated with the light of the diazo copying machine-use fluorescent lamp 83b. The irradiation time is set to a cycle of 4 m.sec. from the start of energizing the heating resistors. Then, at the time of effecting black color recording, after a lapse of 1 m.sec. upon completion of the irradiation, i.e., in 5 m.sec. from the time of starting energization, heating resistors corresponding to the image signals representing white are energized for 2 m.sec. without energizing those corresponding to image signals representing black and are, at the same time, irradiated uniformly with the light of the high color rendering green fluorescent lamp 83c. The irradiation time is 4 m.sec. as in the above. A negative latent image is formed by controlling the recording head 83a in correspondence with the image signals representing black, red, and white in the procedure as described above. The transfer recording medium 81 is conveyed by the rotation of the heat roller 84a in synchronization with a repeated cycle of 10 m.sec/line. When the ink layer 81b on which the latent image has been formed in the transfer section 84 is held in pressure contact with the recording medium 85 and is heated, ink images of the two colors of black and red are transferred onto the recording medium 85.

At the time of recording as described above, when the transfer recording medium 81 is paid out, the disc 89a rotates. At this time, an eddy current flows in the disc 89a in which a magnetic field has been provided in the direction of its thickness, and a braking force is produced in the direction which prevents the rotation of the disc 89a. Consequently, brakes are applied to the rotation of the supply roll 82 directly coupled with the disc 89a, thereby providing back tension to the feeding of the transfer recording medium 81.

The brake operates integrally with the angle maintaining means 90. In other words, if the back tension applied to the transfer recording medium 81 is small, an arm 90b rotates in the direction of the arrow b in FIG. 15 by the force of a spring 90d. However, the potentiometer 90e operates in response to the rotational angle thereof to increase the electric current in the brake coil 89b, thereby increasing the braking force applied to the disc 89a. Thus, the back tension applied to the transfer recording medium 81 is increased. Conversely, if the back tension is large, the transfer recording medium 81 is pulled, so that the arm 90b rotates in the opposite direction of the arrow b in opposition to the spring 90d. The potentiometer 90e operates in accordance with the rotational angle thereof, so that the electric current flowing through the brake coil 89b is reduced. Consequently, the braking force applied to the disc 89a becomes small, with the result that the back tension applied to the transfer recording medium 81 can be reduced.

Accordingly, the back tension applied at the time when the transfer recording medium 81 is conveyed constantly assumes a predetermined value. Hence, the transfer recording medium 81 is constantly brought into pressure contact with the recording head 83a of the recording section 83 with a predetermined pressure-contacting force. In addition, when the back tension becomes fixed, the arm 90b remains stationary at a fixed position. Therefore, the transfer recording medium 81 guided by the tension bar 90c, the recording head 83a of the recording section 83, and the guide bar 90f is conveyed with a fixed angle θ and is constantly held in pressure contact with the recording head 83e at a fixed angle.

Therefore, in accordance with this embodiment, it becomes possible for heat to be applied to the transfer recording medium 81 and for light to be applied simultaneously to the ink layer under a fixed condition in which the transfer recording medium 81 constantly pressure-contacts the recording head 83a even if the transfer recording medium 81 is not pressed against the recording head 83a by means of a platen or the like. It should be noted that, although the angle θ is determined from parameters including the rigidity of the transfer recording medium 81, it is set to 120° in this embodiment.

Incidentally, in the above-described embodiment, an example has been shown in which, in the recording section 83, light beams having predetermined wavelengths are applied uniformly from the side of the ink layer 81b of the transfer recording medium 81, and heat is applied from the side of the substrate 81a. However, as another embodiment, an arrangement may be provided such that heat is applied uniformly to the transfer recording medium 81, and light beams having predetermined wavelengths are applied in correspondence with image information. Alternatively, an arrangement may be provided such that, by forming the substrate 81a using a light-transmissive material, light is applied from the side of the substrate 81a, and heat is applied from the side of the ink layer 81b.

Figure 19A:
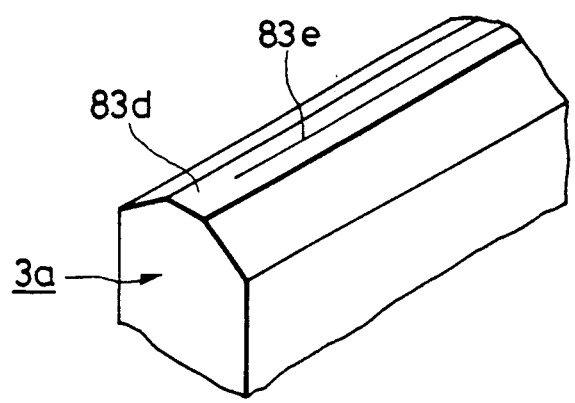
FIGS. 19A and 19B are explanatory diagrams of a recording head in accordance with another embodiment.
Figure 19B:
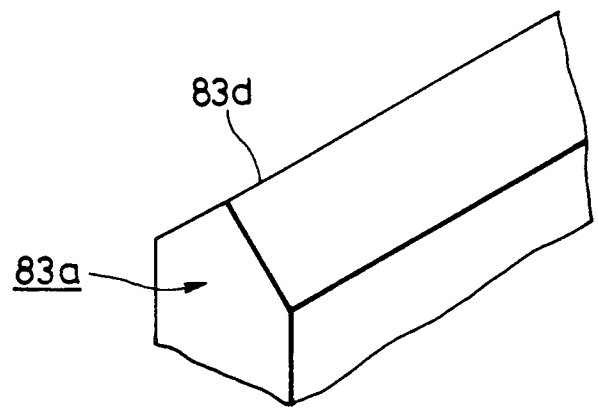

In the foregoing embodiment, although, as the recording head 83a, an arc-shaped one is used, it is also possible to employ, for example, a trapezoidal recording head 83a in which an apex portion 83d provided with an array of heating elements 83e is formed as a flat surface, as shown in FIG. 19A. Alternatively, it is also possible to use a recording head 83a, as shown in FIG. 19B, in which an upper portion thereof is formed in a triangular shape, and the array of the heating elements 83e is provided on the apex portion 83d thereof.

As described above, since this embodiment is arranged such that, when conveying the transfer recording medium, a predetermined tension is provided to the same in the opposite direction of conveying the transfer recording medium, and the transfer recording medium comes into contact with the recording head at a fixed angle, it is not necessary to use a platen or the like for bringing the transfer recording medium into pressure contact with the recording head. Consequently, it is possible to apply light from the side of the transfer recording medium opposite to that to which heat is applied in the recording section, thereby making it possible to apply heat and light efficiently. Furthermore, since the transfer recording medium always comes into contact with the recording head under a fixed condition, this embodiment has an advantage in that recording of excellent images can be effected.

A further embodiment will be described with reference to FIGS. 20 and 21.

The embodiment to be described below allows a braking force which is applied to the supply roll to be adjusted in response to fluctuations in tension applied to the transfer recording medium.

In other words, this embodiment provides an image recording apparatus for forming a recorded image using a transfer recording medium paid out from a supply roll wound up in the form of a roll, comprising: a conductive rotary plate rotating in conjunction with the rotation of the supply roll; an electromagnetic means for providing a magnetic field in the direction of the thickness of the rotary plate; a rotatable member which is held in contact with the transfer recording medium and is rotatable; and a control means for controlling electrical energy to be applied to the electromagnetic means in correspondence with the rotational angle of the rotational member.

According to the above-described embodiment, when the supply roll rotates in conjunction with the paying out of the transfer recording medium, and the rotary disc correspondingly rotates, an eddy current flows through the rotary disc due to a magnetic field produced by the magnetic means. This eddy current produces a braking force to the rotation of the rotary disc, with the result that tension is applied to the transfer recording medium being paid out. When variations occur in the tension being applied to the transfer recording medium, the rotary member contacting the medium rotates, and electric energy applied to the electromagnetic means is controlled in accordance with its rotational angle. Consequently, a fixed braking force is always produced with respect to the rotation of the rotary disc, so that a constant tension is provided to the magnetic recording medium.

Figure 20A:
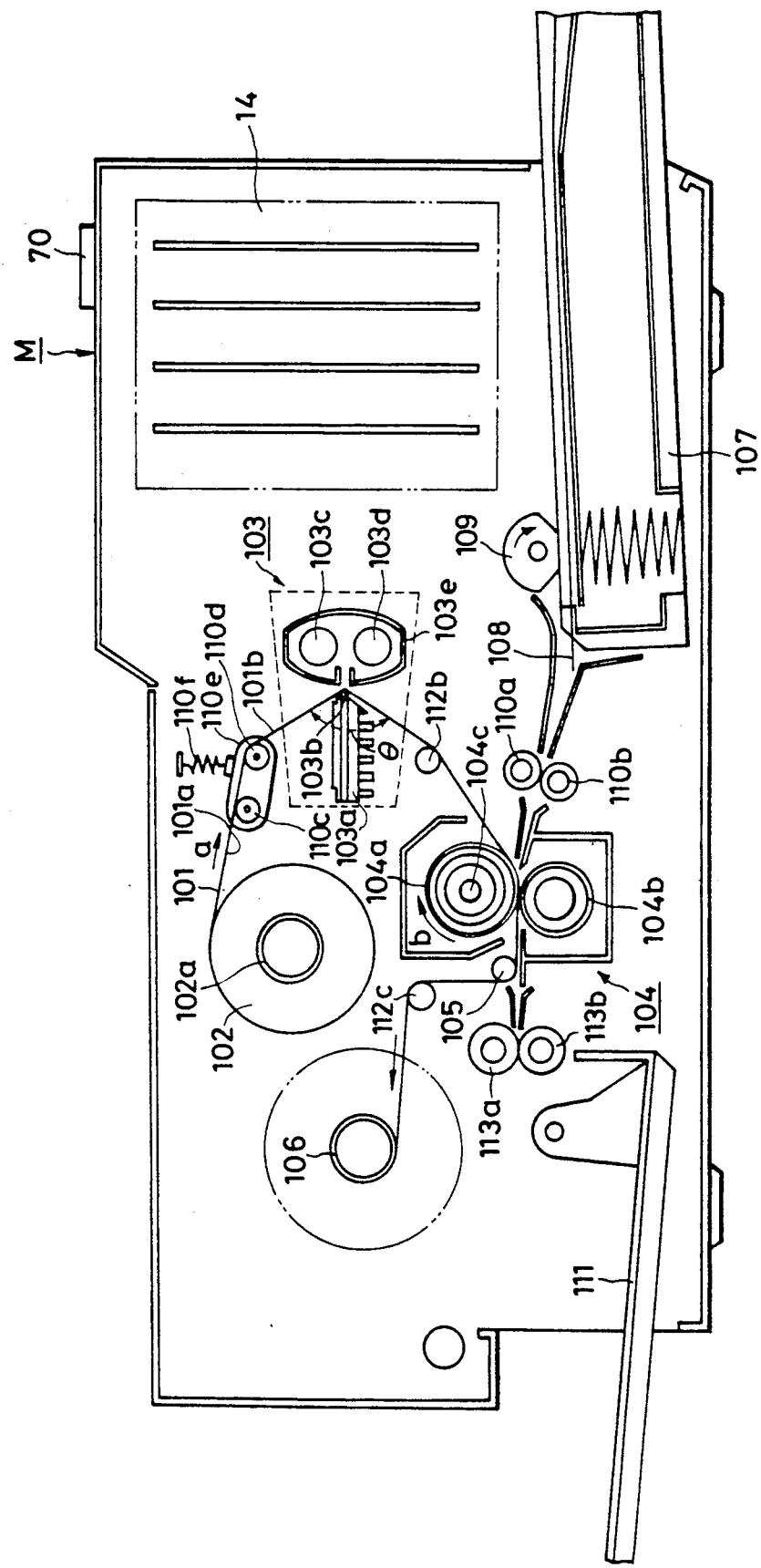
FIG. 20A is a schematic diagram of an image recording apparatus in accordance with a further embodiment of the present invention.
Figure 20B:
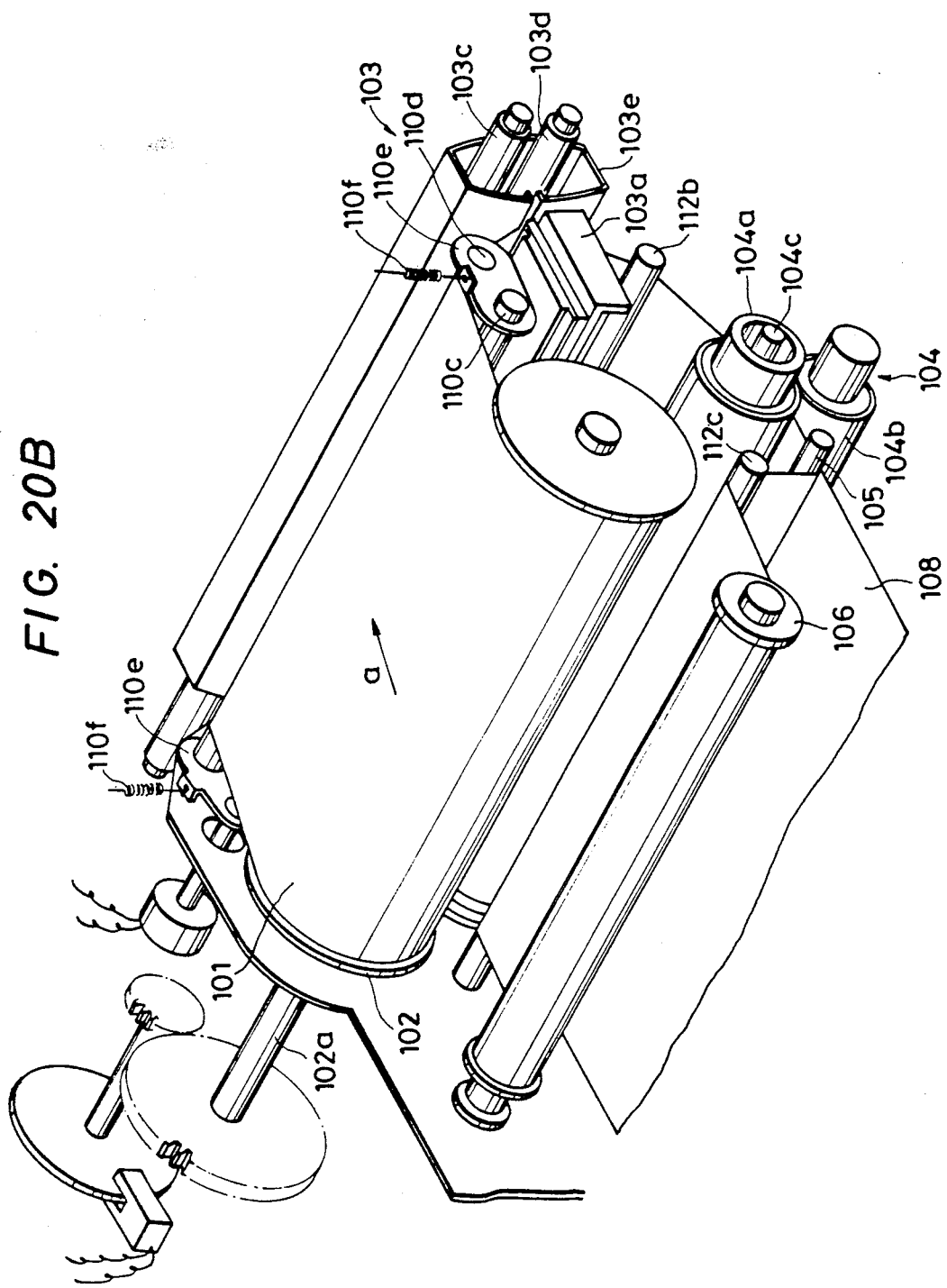
FIG. 20B is a perspective view of essential parts thereof.

FIG. 20A shows a schematic cross-sectional view illustrating an image recording apparatus to which this embodiment is applied, while FIG. 20B is a perspective view thereof.

In the drawings, an elongated sheet-like transfer recording medium 101 is wound up in the form of a roll and is detachably mounted in the main body M of the apparatus as a supply roll 102. In other words, this supply roll 102 is detachably loaded on a rotatable shaft 102a disposed in the main body M of the apparatus.

The tip of the transfer recording medium 101 is passed from the supply roll 102 along guide rollers 110c, 110d, a recording head 103a, and a guide roller 112b, and is further passed between a transfer roller 104a and a pressure roller 104b. Its direction is changed by a release roller 105 and a guide roller 112c, and its tip is led to a takeup roll 106 and is retained at the roll 106 by means of a retaining means such as a gripper (now shown). Subsequently, when the takeup roll 106 is rotatively driven by a known driving means, the transfer recording medium 101 is paid out in the direction of the arrow a and is gradually wound up around the peripheral surface of the take up roll 106.

Incidentally, at the time of the above-mentioned winding-up operation, the supply 102 is provided with a fixed back tension by a means which will be described below. Thus, the arrangement is such that, by virtue of this tension and the guide rollers 112a, 112b, the transfer recording medium 101 is conveyed while being held in pressure contact with the recording head 103a with a constant pressure and at a fixed angle.

Description will now be made individually of the arrangement of the respective parts.

Figure 21:
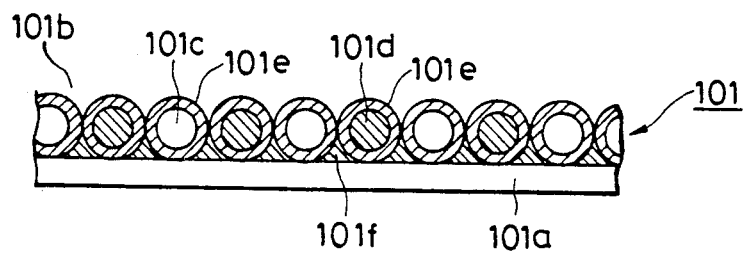
FIG. 21 is a diagram illustrating the arrangement of a transfer recording medium.

First, as shown in FIG. 21, the transfer recording medium 101 is arranged such that a transfer recording layer 101b having properties which allow an image to be formed when heat and light energy is applied thereto is adhered on a sheet-like substrate 101a.

To cite an example, the transfer recording layer 101b is obtained by forming microcapsule-like image-forming elements by the method shown below using the components shown in FIGS. 8 and 9 as cores 101c, 101d.

TABLE 8

| Item | Component | wt. % |
|---|---|---|
| Polymerizable prepolymer | $(CH_2=CHCOOCH_2.CH_2.O.CO.NH$—⟨H⟩—$)_2 CH_2$ | 68 |
| Reaction initiator | Irgacure-184 (mfd. by Ciba-Geigy Corp.)/ethyl-p-dimethyl-amino-benzoate | 2/2 |
| Binder | Elvasite 2041 (mfd. by du-Pont) | 23 |
| Colorant | Sumitone Carmine (mfd. by Sumitomo Chemical Co., Ltd.) | 20 |

TABLE 9

| Item | Component | wt. % |
|---|---|---|
| Polymerizable prepolymer | $(CH_2=CHCOOCH_2.CH_2.O.CO.NH$—⟨H⟩—$)_2 CH_2$ | 68 |
| Reaction initiator | 2-chlorothioxanthone/ethyl-p-dimethyl-amino-benzoate | 1.4/2 |
| Binder | Elvasite 2041 (mfd. by du-Pont) | 23.6 |
| Colorant | Lionel Blue FG-7330 (mfd. by Toyo Ink Mfg. Co., Ltd.) | 5 |

First, 10 g of the components shown in Tables 8 and 9 are each mixed with 20 parts by weight of methylene chloride. The mixture is then mixed with 200 ml of water in which 1 g of gelatine and a cationic or nonionic surface active agent having an HLB value of at least 10 or above is dissolved. This mixture, while being heated to 60° C., is agitated by a homo-mixer at a speed of 8000–10,000 r.p.m. to emulsify, thereby to obtain oily drops having an average grain size of 26 μm.

The agitation is further continued at 60° C. for 30 minutes, and the average grain size is reduced to 10 μm by removing methylene chloride by distillation. To these oily drops is added 20 ml of water in which 1 g of rubber arabic is dissolved. While the oily drops are being cooled gradually, NH4OH (ammonium) water is added to the same to set the pH to 11 or above, thereby obtaining a microcapsule slurry. The capsule walls are hardened by slowly adding 1.0 ml of a 20% aqueous solution of glutaric aldehide.

Subsequently, the microcapsule slurry is separated into a solid and a liquid using a Nutsche funnel. The solid is then dried by a vacuum cleaner for 10 hours at 35° C., thereby obtaining microcapsule-like image-forming elements.

These image-forming elements are microcapsules in which the cores 101c, 101d prepared by the components shown in Tables 8 and 9 are respectively covered with shells 101e and are formed into a particle size of 7–15 μm and an average particle size of 10 μm.

The transfer recording medium 101 is arranged by adhering the image-forming elements formed as described above onto the substrate 101a by means of an adhesive 101f.

To describe the medium 101 in greater detail, the adhesive 101f in which the polyester adhesive Polyester LP-022 (solid content: 50%) manufactured by Nippon Synthetic Chemical Industry Co., Ltd is dissolved in toluene at a ratio of 1 cc to 3 cc is applied to the substrate 101a constituted by a 6-μm polyethylene terephthalate film. Subsequently, the solvent is removed by drying and, the thickness is measured to be about 1 μm. Since this adhesive 101f has a glass transition point of −15° C., a small amount of tack remains even at room temperature, which makes it possible to allow the image-forming elements thus formed to be readily adhered onto the substrate 101a.

Subsequently, the image-forming elements are firmly secured onto the substrate 101a by applying a pressure of about 1 kg/cm$^2$ and heat energy of about 80° C., thereby forming the transfer recording medium 101.

The reaction initiator shown in Table 8 assumes a color of magenta at the time of image formation, while the reaction initiator shown in Table 9 assumes a color of blue at the time of image formation.

Next, description will be made of the recording section 103. The recording section 103 is composed of a heating means and an irradiation means.

The heating means is arranged such that an array of 8 dot/mm, A4-size, line-type heating resistors 103b having a width of, for instance 0.2 mm, which generates heat in correspondence with image signals, is arranged on the surface of the recording head 103a. The arrangement is such that the substrate 101a side of the transfer recording medium 101 is held in pressure contact with the array of heating resistors 103b by means of back tension at the time of conveyance with a constant pressure, as described before. Incidentally, the image signals are issued from a control section (not shown) of a facsimile apparatus, an image scanner, or an electronic blackboard, or the like.

Meanwhile, two fluorescent lamps 103c, 103d of, for instance, the 20-watt type, which constitute the irradiating means, are disposed on the side of the transfer recording layer 101b opposing the recording head 103a such as to be about 25 mm apart from the transfer recording medium 101.

Furthermore, a housing 103e is provided for the fluorescent lamps 103c, 103d with a distance of about 0.5 mm from the transfer recording medium 201 and an opening width of 1.2 mm, so that the direct rays of light from the fluorescent lamps 103c, 103d will be applied only to a region of the transfer recording medium 101 immediately above the array of heating resistors.

The transfer section 104 will now be described. The transfer section 104 is disposed on the downstream side of the aforementioned recording section 103 in terms of the conveying direction of the transfer recording medium 101. This transfer section 104 is composed of the transfer roller 104a rotatively driven in the direction of the arrow b shown in FIG. 20A and the pressure roller 104b held in pressure contact with the transfer roller 104a. The transfer roller 104a is constituted by an aluminum roller with its surface covered with 1 mm-thick silicone rubber with a hardness of 70°, and is arranged such that the temperature of its surface will be held at 90°–100° C. by means of a built-in 800 W halogen heater 104c.

The pressure roller 104b is composed of an aluminum roller with its surface covered with 1 mm-thick silicone rubber having a hardness of 70°, and a pressing force thereof relative to the transfer roller 104a is set such as to become 6–7 kgf/cm by a pressurizing means (not shown) such as a spring.

Recording paper 108 constituting the recording medium, which is accumulated inside a cassette 107 is arranged such as to be fed to the transfer section 104 by means of a feed roller 109, and a pair of registration rollers 110a, 110b in synchronization with an image area of the transfer recording medium 101 such as to overlap the same.

Description will now be made of operation in cases where recording is effected using the recording apparatus constructed as described above.

It should be noted that, in the embodiment described below, an example is shown in which heat is selectively applied in correspondence with image signals and light is applied uniformly.

An image is formed if a motor (not shown) is driven to pay out the transfer recording medium 101 from the supply roll 102, and if, in the recording section 103, light and heat are applied to the transfer recording layer 101b of the transfer recording medium 101 in correspondence with image signals.

In other words, the transfer recording layer 101b has a characteristic that, if a light beam of a predetermined wavelength and heat are applied thereto, its glass transition point rises, so that an image fails to be transferred to a recording medium 108. Therefore, at the time of magenta color recording, the heating resistors of the array of heating resistors 103b, corresponding to image signals representing magenta, are not energized, and those corresponding to image signals representing white (the recording medium 108 is assumed to be white) are energized for 25 m.sec. Those portions are uniformly irradiated with the light of the fluorescent lamp 103c. At this juncture, the irradiation time is set to a cycle of 45 m.sec.

Then, at the time of effecting blue color recording, after a lapse of 50 m.sec. upon completion of the irradiation, i.e., in 100 m.sec. from the time of starting energization, heating resistors corresponding to the image signals representing white are energized for 25 m.sec. without energizing those corresponding to image signals representing blue and are, at the same time, irradiated uniformly with the light of the fluorescent lamp 103d after 5 m.sec. The irradiation time at this juncture is 45 m.sec. as in the above.

A negative image is formed on the transfer recording layer 101b by controlling the recording head 103a in correspondence with the image signals representing blue, magenta, and white in the procedure as described above. The transfer recording medium 101 is conveyed in synchronization with a repeated cycle of 200 m.sec./line. When the transfer recording layer 101b on which the latent image has been formed in the transfer section 104 is held in pressure contact with the recording medium 108 and is heated, transferred images of the two colors of blue and magenta can be transferred onto the recording medium 108. Furthermore, the transfer recording medium 101 and the recording paper 108 which have passed through the transfer section 104 are released by a release roller 105, the transfer recording medium 101 is wound up by a takeup roll 106, and the recording paper 108 for which transfer of images has been completed is discharged onto a tray 111 by means of a pair of discharge rollers 113a, 113b.

Figure 22:
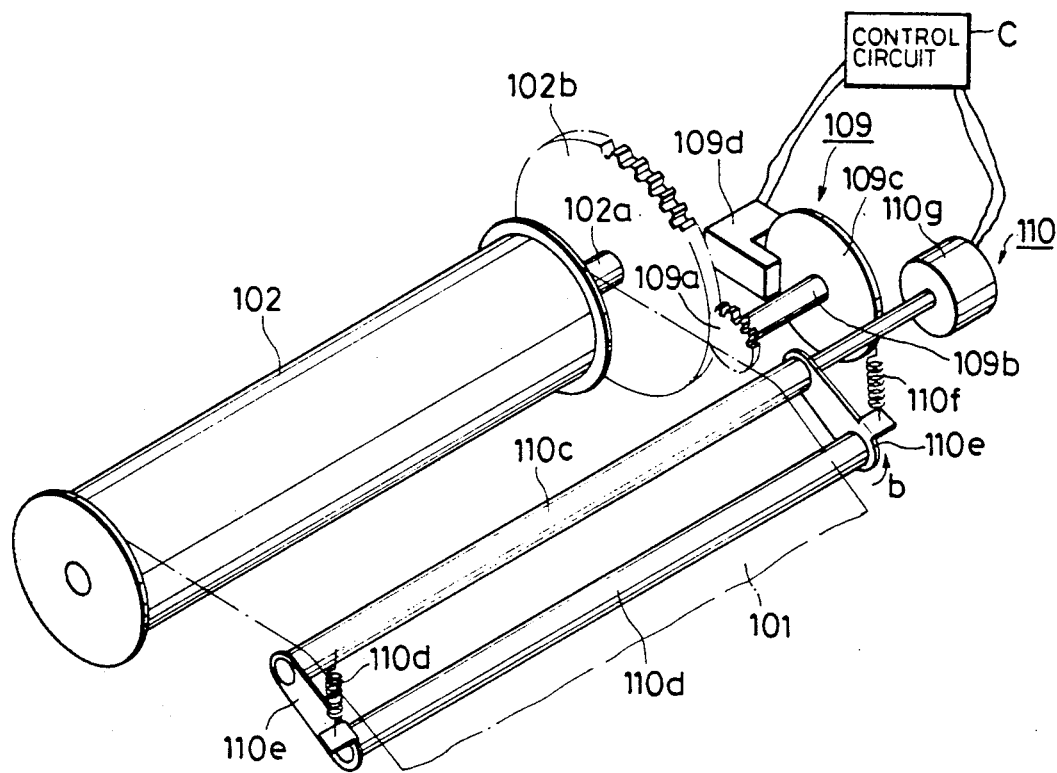
FIG. 22 is a perspective view of essential portions of the apparatus shown in FIG. 20A.

In this embodiment, as shown in FIG. 22, a shaft 102a of the supply roll 102 is provided with a means 109 (hereinafter referred to as the "tension means") to the transfer recording medium 101, which will be described below, in the opposite direction of the conveying direction, i.e., back tension. In addition, a rotary means 110 which contacts the transfer recording means 109 being conveyed with a constant pressure and is rotatable is disposed on the upstream side of the transfer recording medium 101 being conveyed (using the recording section 103 as a reference).

A detailed description will now be made of the tension means 109. As shown in FIG. 22, a gear 102b having 160 teeth is secured to the shaft 102a of the supply roll 102, while a gear 109a having 16 teeth is rotatably engaged with the gear 102b. Furthermore, a 2.5 mm-thick aluminum rotating plate 109c is secured to a shaft 109b of the gear 109a. A brake coil 109d which constitutes an electromagnetic means for providing a magnetic field in the direction of its thickness is disposed on the rotary plate 109c such as to clamp the rotary plate 109c.

In addition, a rotating means 110 is disposed downstream from the supply roll 102 The rotating means has the following construction.

The rotating means is provided with a guide bar 110c. To the guide bar 110c is secured an arm 110e. A tension bar 110d is provided at the tip of the arm 11e. The tension bar 110d is pulled upwardly by a spring 110f and is pressed against the substrate 101 of the transfer recording medium 110 by a constant force. Furthermore, the guide bar 110c is provided with a potentiometer 110g which constitutes a control means for controlling a current flowing to the brake coil 109d. As a result, when the arm 110e rotates in correspondence with the tension of the transfer recording medium 101, the rotational angle of the guide bar 110c rotating with the same is converted into electric signals. The electric signals of the potentiometer 110g are used to control an electric current flowing to the brake coil 109d via a known control circuit C so as to provide a constant brake to the rotation of the shaft 102a, so that back tension will be imparted to the transfer recording medium 110 being paid out and that the tension bar 110d will constantly assume a fixed position. Incidentally, as the position of the tension bar 110d becomes fixed, as described above, an angle $\theta$ of the transfer recording medium 101 which is guided by the tension bar 110d, a recording section 103, and a guide bar 112b disposed downstream of the recording section 83 becomes fixed.

As shown in FIG. 16, the recording section 103 has a recording head 103a provided with the arc-shaped heating surface which comes into contact with the substrate 101a side of the transfer recording medium 101. An array of 8-dot/mm, A-4 size (209 mm × 297 mm) heating elements of the line type each having a width of 0.2 mm are arranged on the surface of the recording head 103a. Since the transfer recording medium 101 is provided with back tension by the braking operation of the supply roll 102, the transfer recording medium 81 is brought into pressure contact with the heating surface of the recording head 103a with a fixed pressure.

At the time of recording, if the transfer recording medium 101 is paid out, the supply roll 102 rotates. Since the rotational speed is increased in correspondence with the gear ratio as the rotation is transmitted via the gears 102 and 109b. Consequently, the rotary plate 109 rotates at a number of revolutions which is 10 times as large as the that of the supply roll 102. At that time, an eddy current flows through the rotary plate 109c to which an electric field has been applied in the direction of its thickness, with the result that a braking force is produced in the direction which hinders the rotation of the rotary plate 109c. Hence, brakes are applied to the rotation of the supply roll 102 which is connected to the rotary plate 109c, so that back tension is applied to the conveyance of the transfer recording medium.

The aforementioned brake is controlled in conjunction with the rotation of the arm 110e. In other words, if the back tension applied to the transfer recording medium 101 is small, an arm 110e rotates in the direction of the arrow b in FIG. 22 by the force of a spring 110f. However, the potentiometer 90e operates in response to the rotational angle thereof to increase the electric current in the brake coil 109d, thereby increasing the braking force applied to the rotary plate 109. Thus, the back tension applied to the transfer recording medium 101 is increased. Conversely, if the back tension is large, the transfer recording medium 101 is pulled, so that the arm 110e rotates in the opposite direction of the arrow b in opposition to the spring 100f. The potentiometer 110g operates in accordance with the rotational angle thereof, so that the electric current flowing through the brake coil 109d is reduced. Consequently, the braking force applied to the rotary plate 109c becomes small, with the result that the back tension applied to the transfer recording medium 81 can be reduced.

Accordingly, the back tension applied at the time when the transfer recording medium 101 is conveyed constantly assumes a predetermined value. Hence, the transfer recording medium 101 is constantly brought into pressure contact with the recording head 103a of the recording section 83 with a predetermined pressure-contacting force. Consequently, application of heat to the transfer recording medium 101 from the recording head 103a is effected on a stable basis.

In addition, when the back tension becomes fixed, the arm 11e remains stationary at a fixed position. Therefore, the transfer recording medium 101 guided by the tension bar 110d, the recording head 103a of the recording section 103, and the guide bar 112b is conveyed with a fixed angle $\theta$ and is constantly held in pressure contact with the recording head 103a at a fixed angle.

Therefore, in accordance with this embodiment, it becomes possible for heat to be applied to the transfer recording medium 101 and for light to be applied simultaneously to the ink layer under a fixed condition in which the transfer recording medium 101 constantly pressure-contacts the recording head 103a even if the transfer recording medium 101 is not pressed against the recording head 103a by means of a platen or the like.

Incidentally, although, in the foregoing embodiment, the case of two-color recording has been described as an example of imparting a fixed tension to the transfer recording medium, it goes without saying that the embodiment can be similarly applied to the cases of single-color recording and recording using three or more colors as well.

Furthermore, although, in the foregoing embodiment, an example has been shown in which a latent image is formed by applying heat and light energy to the transfer recording medium 101 to transfer the latent image onto the recording medium 5, the arrangement for imparting tension to the transfer recording medium can similarly be applied to a thermal transfer recording method whereby, using a transfer recording medium with hot-melt (including softening and sublimation) ink coated on a substrate, an image is transferred onto a recording medium by melting ink by applying heat to the transfer recording medium from a recording head in correspondence with image signals.

As described above, since the present embodiment is arranged such that a rotary plate is provided which rotates in conjunction with the rotation of a supply roll at the time of conveying the transfer recording medium wound around the supply roll so as to generate an electromagnetic field in the direction of the thickness of the rotary plate, and a means for controlling the electromagnetic field is provided, an eddy current is produced in the rotary plate, thereby making it possible to provide a predetermined braking force to the rotation of the supply roll. Since this allows a fixed tension to be provided to the transfer recording medium being conveyed, it becomes possible for the transfer recording medium to be held in pressure contact with the recording head with a fixed pressure without using a platen required in a conventional apparatus.

A further embodiment will be described with reference to FIGS. 23 and 24.

In the embodiment described below, by forming the substrate of the transfer recording medium using a light-transmissive material, a light source for applying light energy to the transfer recording medium is disposed on the side of the transfer recording medium where the substrate is located when the transfer recording medium is fed along the conveying route, while a heat source for applying heat energy to the transfer recording medium is disposed on the side of the transfer recording medium where the transfer recording layer is located when the transfer recording medium is fed along the conveying route.

Figure 23:
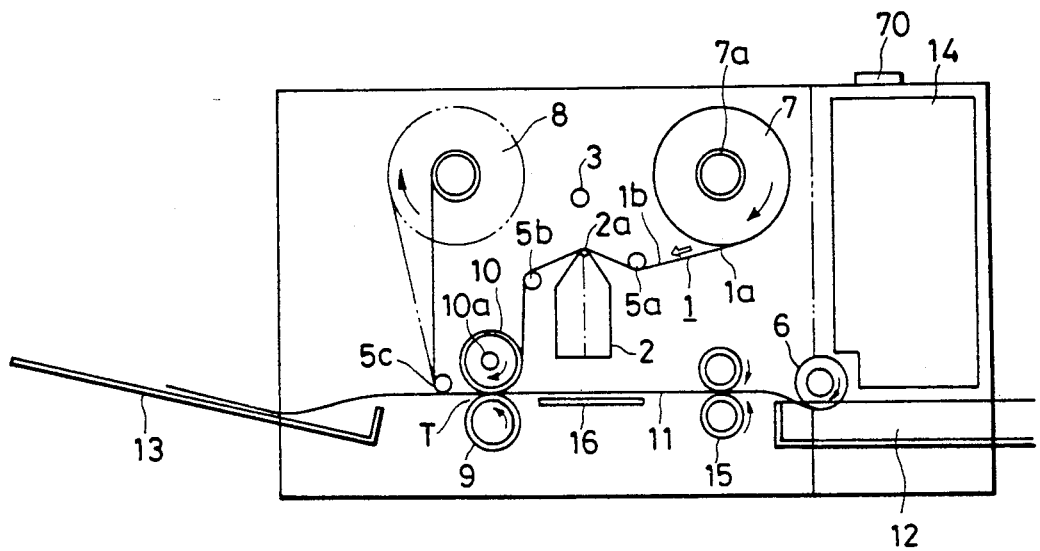
FIGS. 23 and 24 are side elevational views of image forming apparatuses to which the present invention is applied.

FIG. 23 shows an example of a single color image-forming apparatus to which the embodiment of the present invention is applied. The transfer recording medium 1 used in the apparatus of this embodiment is arranged such that the image-forming elements 31 composed of components shown in Table 1 above are dispersed in a binder, and the mixture is provided on the substrate 1b constituted by a 6 um-thick polyester film. The sensitizer in the image-forming elements absorbs light in the range of about 500-600 nm to initiate the reaction. Incidentally, transparent polyimide, transparent aramide, and the like can be used as the material of the substrate 1b, as well as the transparent polyester film.

Therefore, in accordance with the present invention, heat from the thermal head 2 is imparted to the recording layer 1a via the substrate 1b, while light from the fluorescent lamp 3 is applied directly to the recording layer 1a. Consequently, a transferred image corresponding with image signals for each line is formed sequentially on the transfer recording medium 1 thus conveyed. The transferred image thus formed on the transfer recording medium 1 is conveyed to the pressure contacting portion T constituted by the transfer roller 10 and the pressure roller 9. At the same time, however, the recording paper 11 is also conveyed to the pressure contacting section simultaneously with the transferred image by means of the registration roller 15 which rotates in synchronization, as described before, and the transferred image is transferred onto the recording paper 11 by means of a pressure-contacting force acting between the rollers 9 and 10. The recording paper for which the transfer has been completed is discharged onto a paper discharging tray 13.

The images obtained on the recording paper by the image-forming apparatus described above are very clear, and high-quality images with good fixing characteristics can be obtained.

Figure 24:
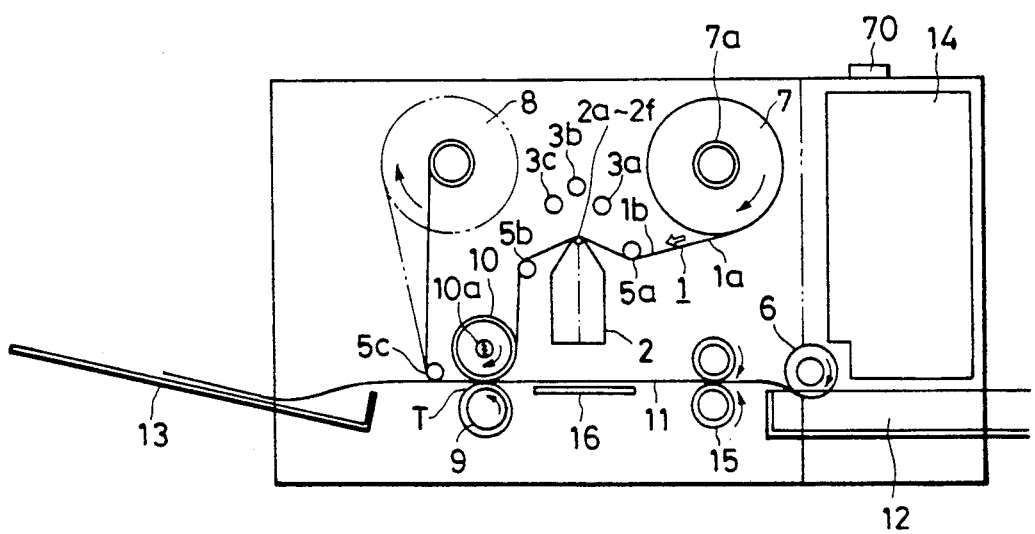

With reference to FIG. 24, description will now be made of an embodiment in which the image-forming method employed in the present invention is applied to a multi-color image-forming apparatus.

It is possible to effect multi-color recording by using the transfer recording medium in which the image-forming elements 31, which are respectively sensitive to four different kinds of wavelength and form different tones, i.e., yellow, magenta, cyan, and black, as already described, are disposed on the substrate 1b. As for such transfer recording medium 1, one in which the image-forming elements shown in Tables 3-5 are dispersed in a binder, and the mixture is disposed on the substrate 1b constituted by a 6 μm-thick polyester film was used. The reaction initiators in the image-forming elements shown in Tables 3, 5 absorb light in the ranges of about 340-380 nm, about 380-450 nm, and about 450-600 nm, respectively, to start the reaction. The colors at the time of image formation are cyan, yellow, and magenta in that order.

An apparatus for obtaining multi-color images using this transfer recording medium 1 is shown in FIG. 7.

The point which differs from the single color image-forming apparatus shown in FIG. 3 is that four light sources 3a, 3b, 3c, and 3d having different wavelengths are disposed.

A high color rendering fluorescent lamp 3a, a diazo copying machine-use fluorescent lamp 3b, and a black light 3c were used as the fluorescent lamps. In particular, a sharp cut filter-L-3818 was disposed in front of the diazo copying machine-use fluorescent lamp 3b so as to obtain desired spectroscopic characteristics corresponding to the image-forming elements.

Incidentally, the guide rollers 5a, 5b in this embodiment are swingable unlike those of the embodiment shown in FIG. 3. In other words, as shown in FIG. 7, two arms 5e are respectively swingable with shafts 5i as their rotational centers, and the guide rollers 5a, 5b are respectively disposed on the arms 5e, and are swingable with the shafts 5i as their rotational centers. Two springs 5f provide forces to the arms 5e by a fixed tension in the directions of the arrows a, b, respectively Stoppers 5g, 5h are provided to restrict the rotational angles of the arms 5e.

By virtue of the above-described arrangement, the guide rollers 5a, 5b are located at positions where the tension provided to the transfer recording medium 1 and the force exerted by the spring 5f are balanced. As the tension of the transfer recording medium 1 fluctuates, the guide rollers 5a, 5b are swingable within the range of fixed angles which are restricted by the stoppers 5g, 5h. Consequently, the transfer recording medium 1 is guided by the guide rollers 5a, 5d in such a manner as to abut against the thermal head 2 within a fixed angle (for instance, about 45° C.$<\theta<$180° C. in this embodiment).

FIG. 8 shows the spectroscopic characteristics of the fluorescent lamps in this embodiment.

Description will now be made of a process for obtaining color images in response to image signals corresponding to yellow, magenta, cyan, and black in accordance with a chart showing the recording timing of the multi-color image-forming apparatus, shown in FIG. 9, in accordance with this embodiment.

First, heating resistors corresponding to the signals representing white are energized for 2 m.sec. without energizing the heating resistors corresponding to image signals representing yellow and, at the same time, are uniformly applied with the light of the diazo copying machine-use fluorescent lamp 3b. The irradiation time is set at 4 m.sec. After a lapse of 1 m.sec. upon completion of the irradiation, heating resistors corresponding to the image signals representing white are energized for 2 m.sec. without energizing the heating resistors corresponding to image signals representing magenta, and, at the same time, are uniformly irradiated with the light of the high color rendering green florescent lamp 3a. The irradiation time is 4 m.sec. as with yellow. Similarly, the formation of a latent image of all the four colors is completed by applying the light of the black light 3c in the case of cyan and the light of the health ray lamp 3d in the case of black. Accordingly, it takes 15 m.sec. to form one line of an image.

By repeating the above-described process for each line, it is possible to obtain a full-color image on the recording paper.

Incidentally, the set conditions for components other than the light sources are the same as those in the embodiment for single-color recording, and the conveyance of the recording paper 11 and the transfer recording medium 1 is the same as that for the above-described embodiment for single-color recording.

Full-color images thus obtained on the recording paper are free of color drift, have a high saturation, and are clear high-quality images with good fixing properties.

Therefore, in accordance with the present embodiment, roller-like members are used in the construction of the apparatus. However, the members constituting the fixing section and the transfer section should not be restricted to roller-like members. For instance, one such as rotary belts may be used if the arrangement is such as to allow a desired pressure to be obtained.

In addition, in the embodiment in which a fixing means is provided, the amounts of heat and pressure applied to the recording paper should not be restricted to values shown in the aforementioned embodiment, and may be set, as desired, in accordance with the properties of the transfer recording layer, the surface condition of the recording paper, and the like. Furthermore, in the various embodiments described above, the arrangement is such that, in the recording section, light beams having predetermined wavelengths corresponding to desired colors are applied uniformly from the side of the transfer recording layer of the transfer recording medium, and heat corresponding to image signals is applied from the side of the substrate. However, as another embodiment, an arrangement may be provided in which heat is applied uniformly, and desired light beams are applied in correspondence with image signals.

Furthermore, in the respective embodiments described above, although the application of light and heat is effected with the substrate placed in between. However, it is also possible to effect image formation by performing the application of both light and heat from one side of the substrate.

As for the heating means, it is also possible to employ a method heating is carried out selectively using a YAG laser and a polygon mirror, in addition to the method of using the recording head.

As for the irradiating means, in addition to the method in which the fluorescent lamp is used, it is also possible to employ, for instance, a method in which an LED array is used, or one in which a xenon lamp and a filter which have matching light absorption characteristics in terms of their material.

Incidentally, although, in the embodiments described above, heat energy and light energy are applied simultaneously, they may not be adapted to effect the application simultaneously, insofar as the two kinds of energy are applied as a consequence.

In the embodiment described above, an example has been shown in which an image is transferred onto recording paper by virtue of a change if the softening temperature of the transfer recording layer of a polymer material containing a colorant as a result of light and heat energy applied. However, an arrangement may be provided such that an image is transferred and recorded by virtue of a difference in the characteristics of adhesion onto the recording paper or sublimation characteristics. Alternately, an arrangement may be provided such that the recording paper is provided with a coloring property, and the transfer recording medium is provided with such a layer that will change the coloring property of the recording paper, so that an image formed on the transfer recording medium is transferred onto the recording paper, thereby obtaining a recorded image.

Furthermore, in the various embodiments described above, the material may be such that the softening temperature of the transfer recording layer rises on application of the plurality of kinds of energy, or conversely drops.

The plurality of kinds of energy applied to the transfer recording layer should not be restricted to heat and light energy mentioned above, and an image may be formed by means of other energy such as pressure energy.

As for the material of the substrate, in addition to the aforementioned polyethylene phthalate, it is also possible to use polyamide, polyimide, condenser paper, cellophane paper, and so forth.

As for the transfer recording layer, it is possible to select appropriately and employ one having a hot-melt, heat softening, or heat sublimation property, or other quality.

Furthermore, the recording medium should not be restricted to the aforementioned recording paper, and, for instance, a plastic sheet for an overhead projector (OHP) can naturally be used.

In addition, as is apparent from the foregoing, the desired object of the present embodiments can be attained by providing an image forming apparatus having a process in which, under a condition in which at least one kind of energy among light and heat is applied in correspondence with recording information, a transferred image is formed by applying light and heat energy to a transfer recording medium having a transfer recording layer whose physical properties governing transfer characteristics change upon application of light thereto and a process in which the transferred image is transferred on a recording medium.

In other words, in the image recording apparatus in accordance with the present embodiments, the processes of formation and transfer of images are separated, and a transferred image has already been formed in the transferred process, so that restrictions on the selective application of energy are eliminated. Thus, it is possible to apply to the transfer recording medium energy necessary for allowing clear images to be transformed and in correspondence with the surface properties of the recording medium. Additionally, since the transferred image formed in the preceding process is not a simple image whose properties have been changed, such as a hot-melt image. Since it is an image whose physical properties governing transfer characteristics have been changed, it becomes possible to positively attain transfer by making use of the difference in the physical properties existing before and after the change, and, moreover, faithful transfer of the transferred image can also be attained. For instance, if a hot-melt image is made into a transferred image, it is desirable to keep the hot-melt image intact from the process of the transferred image formation until the transfer process. However, there is a possibility that the transfer characteristics may decline due to a cooling phenomenon between the two processes and that the hot-melt image may become blurred owing to the heat conduction thereof to its surroundings. In the case of the present embodiments, however, the transferred image is obtained by changing the melting point, softening point, and the viscosity at an identical temperature, and the like of the transfer recording layer in correspondence with the image, so that this change of the physical properties is stored until completion of the transfer process. Furthermore, a decline in the transfer characteristics of the transferred image and blurring of the image do not occur unless energy which changes the physical properties is applied after the process of the transferred image formation. Consequently, even if the surface smoothness of the recording medium is low, it is possible to effect formation of a high-quality image, and an image can be transferred without causing deterioration in the quality of the transferred image.

In addition, in the image recording apparatus in accordance with the present embodiments, the application of energy based on signals for transferred image formation and a uniform application of energy for transfer are separated in terms of their functions. Therefore, in comparison with a case where energy based on signals for transferred image formation must be used simultaneously as energy for transfer, the condition of application of energy can be alleviated. For instance, the amount of energy necessary for transferred image formation may only be such as to cause a change in the physical property of the transfer recording layer. Also, since the energy for transfer may be uniform energy which is not based on signals, the energy can be increased in conjunction with a desired transfer speed. Thus, high-speed recording can be readily attained.

In the case of a thermal head employed in a conventional heat transfer recording apparatus, the highest heat-responsive speed is 1-5 m.sec. or thereabout. Accordingly, if an attempt is made to drive the thermal head at a repeated cycle faster than that, the rise and drop of the temperature fails to be carried out sufficiently within a cycle, so that heating becomes insufficient, or, conversely, the temperature fails to drop sufficiently. Hence, the effect of heat accumulation appears in the quality of the image. This has been one of the major factors impeding the creation of a high-speed image recording apparatus. However, if a plurality of kinds of energy are used as in the case of the present embodiments, and if, for example, a thermal head and irradiation with light are combined, even if heat is accumulated, it is only at the time of irradiation that the heated condition is effective, so that it becomes possible to reduce the effect of the speed of the temperature drop subsequent to the peak temperature experienced in the past, by effecting irradiation only during a limited time interval in the vicinity of the peak temperature. For this reason along, even if a conventional thermal head is used, it becomes possible to effect a recording operation in a shorter repeated cycle, thereby facilitating high-speed recording.

Since the image recording apparatus in accordance with the present embodiments form transferred images by applying a plurality of kinds of energy, as compared with a conventional case where a transferred image is formed by heat alone, the kind of energy for forming a transferred image becomes plural. Accordingly, it becomes possible to adjust the degree of change in the physical property for forming the transferred image. Also, as for the plurality kinds of energy, even in the case where heat is used, other energy such as light which has a quick response speed and which allows intense adjustment in stages to be effected readily is used in combination. Therefore, formation of images having half-tone can be facilitated. For example, if the intensity or period of irradiation is set in three stages in combination with heating, it becomes possible to express the tone in four stages (three stages plus nonheating).

The need for effecting the control of such operations at high speed is anticipated, and the fact that energy such as light which has a quick response speed can be used jointly allows high-speed recording of the half tone.

In the method of image formation in accordance with the present embodiments, a transferred image is formed by changing a physical property governing transfer characteristics. This physical property is determined arbitrarily depending on the kind of the transfer recording medium used. For instance, in the case of a transfer recording medium in which an image is transferred after it is set in a hot-melt state, the physical property is the melting temperature, softening temperature, glass transition point, or the like. In the case of a transfer recording medium in which transfer is effected after the transferred image is set in an adhesive state or in a state in which the transferred image is permeable to the recording medium, the physical property is the viscosity at an identical temperature.

It should be noted that, in the image recording apparatus of this invention, it is possible to obtain a recorded image in a single color, two colors, a multi-color of three or more colors, or a full color by employing, in addition to the above-described image forming process and transfer recording medium, the process described in the specifications of the aforementioned patent applications filed earlier by the present applicant and by selecting, as required, the kinds of a colorant for forming image forming elements and a reaction initiator and by selecting a light source of a wavelength necessary for the reaction of the reaction initiator, as described in the aforementioned specifications.

As described above, the present invention provides a recording apparatus which is capable of recording high-quality images on a recording medium having a low surface smoothness.

What is claimed is:

1. An image recording apparatus comprising:
   conveying means for conveying a transfer recording medium, said transfer recording medium having a transfer recording layer with transfer properties which vary in response to application of optical and heat energy;
   a recording section disposed along a conveying route of said transfer recording medium conveyed by said conveying means and having first energy applying means for applying said heat energy to said transfer recording medium and second energy applying means for applying said optical energy thereto;

tension imparting means for imparting tension to said transfer recording medium such that said tension recording medium is pressed against said first energy applying means;

transfer means for transferring an image formed on said transfer recording medium in said recording section to a recording medium; and conveying means for conveying said recording medium to a discharge section via said transfer means.

2. An image recording apparatus according to claim 1, further comprising means for holding said transfer recording medium at a fixed angle with respect to said first energy applying means.

3. An image recording apparatus according to claim 1, wherein said first energy applying means is a thermal head.

4. An image recording apparatus according to claim 1, wherein said second energy applying means is a light source.

5. An image recording apparatus according to claim 1, wherein the change in said transfer properties of said transfer recording layer is in respect of softening temperature.

6. An image recording apparatus according to claim 1, further comprising fixing means disposed on the downstream side of said transfer means in terms of the advancing direction of said recording medium and adapted to fix on said recording medium an image transferred from said transfer recording medium.

7. An image recording apparatus employing a transfer recording medium having a transfer recording layer whose transfer characteristics change upon application of light energy and heat energy thereto, comprising:

conveying means for conveying said transfer recording medium;

a recording section disposed along a conveying route of said transfer recording medium conveyed by said conveying means and having heating means for applying heat energy to said transfer recording medium and irradiating means for applying light energy to said transfer recording medium;

transfer means for transferring onto a recording medium an image formed on said transfer recording medium in said recording section;

tension imparting means for imparting tension to said transfer recording medium; and means for guiding said transfer recording medium such that said transfer recording medium abuts against said heating means at a fixed angle therewith.

8. An image recording apparatus according to claim 7, wherein said transfer recording medium is pressed against said heating means by means of tension.

9. An image forming apparatus employing a transfer recording medium having a transfer recording layer whose transfer characteristics change upon application of light energy and heat energy thereto and a substrate for supporting said transfer recording layer comprising:

a light source disposed on the side of said transfer recording medium where said transfer recording layer is located along a conveying route of said transfer recording medium to apply light energy to said transfer recording medium at the time when said transfer recording medium is fed along said conveying route;

a heat source disposed on the side of said transfer recording medium where said substrate is located for applying heat energy to said transfer recording medium when said transfer recording medium is fed along said conveying route;

transfer means for transferring and fixing to a recording medium an image formed on said transfer recording medium; and conveying means for conveying said recording medium to a position where transfer effected by said transfer means is to take place in synchronization with the image formed on said transfer recording medium.

10. An image forming apparatus according to claim 9, wherein heat energy applied by said heat source is applied to said transfer recording medium in correspondence with image information.

11. An image forming apparatus according to claim 9, wherein the image formed on said transfer recording medium is a single color image.

12. An image forming apparatus according to claim 9, wherein the image formed on said transfer recording medium is a multi-color image.

13. An image forming apparatus according to claim 10, further comprising fixing means for fixing onto said recording medium the transferred image transferred onto said recording medium by said transfer means.

14. An image recording apparatus for forming a recorded image using a transfer recording medium paid out from a supply roll wound up in the form of a roll, comprising:

a conductive rotary plate that rotates in conjunction with the rotation of said supply roll;

electromagnetic means for providing a magnetic field in the direction of the thickness of said rotary plate;

a rotatable member which is held in contact with said transfer recording medium and is rotatable; and control means for controlling the amount of electrical energy to be applied to said electromagnetic means in correspondence with the rotational angle of said rotational member.

15. An image recording apparatus comprising:

feeding means for feeding a transfer recording medium having a transfer recording layer whose physical properties governing transfer characteristics change upon application of light and heat energy thereto;

a recording section having heating means for applying heat energy onto said transfer recording medium fed by said feeding means and irradiating means for applying light energy thereto;

transfer means for transferring to said recording medium an image formed by said transfer recording medium in said recording section;

tension imparting means for imparting tension to said transfer recording medium; and control means for controlling the tension of said tension imparting means in correspondence with the tension of said transfer recording medium.

16. An image recording apparatus according to claim 15, wherein said transfer recording medium is pressed against said heating means by means of tension.

17. An image recording apparatus according to claim 15, wherein said control means has a potentiometer.

18. An image recording apparatus according to claim 15, wherein said tension imparting means has electromagnetic means.

19. An image recording apparatus for effecting a recording on a recording medium, comprising:
   conveying means for conveying transfer recording medium having a transfer recording layer whose transfer characteristics change when a first energy and a second energy different from said first energy are applied thereto;
   a recording section disposed along a conveying route of said transfer recording medium conveyed by said conveying means and having first energy applying means for applying said first energy to said transfer recording medium and second energy applying means for applying said second energy thereto;
   tension imparting means for imparting tension to said transfer recording medium such that said transfer recording medium is pressed against said first energy applying means;
   means for guiding said transfer recording medium such that said transfer recording medium will abut against said first energy applying means at a fixed angle therewith.

20. An image recording apparatus according to claim 19, wherein said first energy applying means is a thermal head.

21. An image recording apparatus according to claim 19, wherein said second energy applying means is a light source.

22. An image recording apparatus according to claim 19, wherein the change in said transfer characteristics is in respect of a softening temperature.

23. An image recording apparatus for conveying a transfer recording medium having a transfer recording layer in which physical properties for determining transfer properties vary in accordance with light energy and heat energy applied thereto and a supporting member for supporting said transfer recording layer, said apparatus comprising the following elements along a conveying path on which said transfer recording medium can be conveyed:
   a light source for applying light energy to said transfer recording layer when said transfer recording medium is conveyed along said conveying path;
   heating means for selectively applying said heat energy to said transfer recording medium in response to an image information provided where said supporting member of said transfer recording medium positions when said transfer recording medium is conveyed along said conveying path;
   transferring means for transferring an image formed on said transfer recording medium onto a recording medium; and
   conveying means for conveying said transfer recording medium when said transfer recording medium is conveyed along said conveying path such that said supporting member is pressed against said heating means by tension applied to said transfer recording medium.

24. An image recording apparatus according to claim 23 further comprising guide means for guiding said transfer recording medium such that said transfer recording medium abuts at a predetermined angle to said heating means.

25. An image recording apparatus according to claim 23 further comprising guide means for controlling the angle by which the transfer recording medium abuts the heating means.

26. An image recording apparatus for conveying along a conveying path a transfer recording medium having a supporting member and a transfer recording layer, said transfer recording layer having physical properties which vary when light and heat energy are applied thereto so as to determine the transfer properties thereof, said apparatus comprising:
   a light source for applying said light energy to said transfer recording medium;
   a heat source for applying said heat energy to said transfer recording medium downstream from said light source in said conveying path;
   transferring means for transferring an image formed on said transfer recording medium onto a medium to be transferred downstream from said heat source in said conveying path; and
   fixing means for fixing said image transferred by said transferring means onto said medium to be transferred downstream from said transferring means in said conveyance path.

27. An image recording apparatus according to claim 26, wherein said light source and heat source are provided along said conveying path.

28. An image recording apparatus according to claim 26, wherein said heat source applies said heat energy to said transfer recording medium in response to image information.

29. An image recording apparatus for recording an image on a recording medium, comprising:
   conveying means for conveying a transfer recording medium along a conveying path, said transfer recording medium having a transfer recording layer with transfer properties which vary on the basis of the application thereto of a first energy and a second energy different from said first energy;
   a recording section provided along the conveyance path, said recording section having first energy applying means for applying said first energy to said transfer recording medium and second energy applying means for applying said second energy to said transfer recording medium;
   transferring means for transferring an image formed on said transfer recording medium at said recording section onto said recording medium; and
   fixing means for fixing said image transferred onto said recording medium to said recording medium.

30. An image recording apparatus according to claim 29, wherein said transfer properties vary in response to softening temperature.

31. An image recording apparatus according to claim 29, wherein said first energy applying means and said second energy applying means are disposed to sandwich said conveyance path of said transfer recording medium.

32. An image recording apparatus according to claim 29, wherein said first energy includes heat energy.

33. An image recording apparatus according to claim 29, wherein said second energy includes optical energy.

34. An image recording apparatus according to claim 29, wherein said transfer recording medium has a supporting member for supporting said transfer recording layer.

35. An image recording apparatus according to claim 34, wherein heating means is provided on the supporting member side of said transfer recording medium and illuminating means is provided on the transfer recording layer side of said transfer recording medium, along said conveyance path.

36. An image recording apparatus according to claim 34, wherein said transfer recording medium is pressed by tension to a heating means along the supporting member side of said transfer recording medium.

37. An image recording apparatus according to claim 29, wherein said transfer recording medium is detachable to an apparatus body.

38. An image recording apparatus according to claim 29, wherein said first energy includes heat energy and is controlled in response to recording information.

39. An image recording apparatus for recording an image on a recording medium, comprising:
 conveying means for conveying a transfer recording medium along a conveyance path, said transfer recording medium having a transfer recording layer with transfer properties which vary on the basis of the application of a first energy and a second energy different from said first energy;
 a recording section provided along the conveyance path, said recording section having first energy applying means for applying said first energy to said transfer recording medium and second energy applying means for applying said second energy to said transfer recording medium;
 transferring means for transferring an image formed on said transfer recording medium at said recording section onto said recording medium; and
 recording medium conveying means for conveying said recording medium to a transfer position near said transfer recording medium in synchronism with said image formed on said transfer recording medium.

40. An image recording apparatus according to claim 39, wherein said transfer properties vary in response to softening temperature.

41. An image recording apparatus according to claim 39, wherein said first energy applying means and said second energy applying means are disposed to sandwich said conveyance path of said transfer recording medium.

42. An image recording apparatus according to claim 39, wherein said first energy includes heat energy.

43. An image recording apparatus according to claim 39, wherein said second energy includes optical energy.

44. An image recording apparatus according to claim 39, wherein said transfer recording medium has a supporting member for supporting said transfer recording layer.

45. An image recording apparatus according to claim 44, wherein heating means is provided on the supporting member side of said transfer recording medium and illuminating means is provided on the transfer recording layer side of said transfer recording medium, along said conveyance path.

46. An image recording apparatus according to claim 44, wherein said transfer recording medium is pressed by tension to a heating means along the supporting member side of the transfer recording medium.

47. An image recording apparatus according to claim 39, wherein said transfer recording medium is detachable to an apparatus body.

48. An image recording apparatus according to claim 39, wherein said first energy includes heat energy and is controlled in response to recording information.

49. An image recording apparatus for recording an image onto a medium to be recorded, comprising:
 conveying means capable of conveying a transfer recording medium having a transfer recording layer, transfer characteristics of which vary upon application of one or more kinds of energy applied by one or more energy applying means;
 a first image forming section provided along a conveyance path in which said transfer recording medium is conveyed by said conveying means so as to apply said energy to said transfer recording medium to form a first image on said transfer recording medium;
 tension imparting means for imparting tension to said transfer recording medium such that said transfer recording medium is pressed against one or more energy applying means; and
 a second image forming section for forming a second image on a recording medium in accordance with said first image formed on said transfer recording medium at said first image recording section.

50. An image recording apparatus according to claim 49, wherein said transfer recording medium and said recording medium are applied with thermal energy in a condition where both of said mediums are in contact with each other at said second image forming section.

51. An image recording apparatus according to claim 49, wherein said transfer recording medium and said recording medium are applied with pressure in a condition where both of said mediums are in contact with each other at said second image forming section.

52. An image recording apparatus according to claim 49, wherein said energy is optical energy.

53. An image recording apparatus according to claim 49, wherein said energy is thermal energy.

54. An image recording apparatus according to claim 49, wherein said energy is controlled in response to image information.

* * * * *

UNITED STATES PATENT AND TRADEMARK OFFICE
CERTIFICATE OF CORRECTION

PATENT NO. : 5,072,245
DATED : December 10, 1991
INVENTOR(S) : Yasuyuki Tamura, et al Page 1 of 5

It is certified that error appears in the above-indentified patent and that said Letters Patent is hereby corrected as shown below:

IN [57] ABSTRACT

Line 1, "which" should be deleted.

COLUMN 1

Line 28, "follows" should read --follows:--.

COLUMN 5

Line 37, "1d." should read --1d.)--.
Line 54, "both" (second occurrence) should be deleted.

COLUMN 7

TABLE 1, "Poly(4,4;-isopropylidene" should read
--Poly(4,4-isopropylidene--.

COLUMN 9

Line 39, "medium 1;" should read --medium 1,--.

COLUMN 11

TABLE 3, "Poly(4,4;-isopropylidene" should read
--Poly(4,4-isopropylidene--.

TABLE 4, "Poly(4,4;-isopropylidene" should read
--Poly(4,4-isopropylidene--.

TABLE 5, "Poly(4,4;-isopropylidene" should read
--Poly(4,4-isopropylidene--.

UNITED STATES PATENT AND TRADEMARK OFFICE
CERTIFICATE OF CORRECTION

PATENT NO. : 5,072,245
DATED : December 10, 1991
INVENTOR(S) : Yasuyuki Tamura et al It is certified that error appears in the above-indentified patent and that said Letters Patent is hereby corrected as shown below:

COLUMN 13

Line 12, "tansferred" should read --transferred--.
Line 37, "roller 26" should read --roller 26b--.
Line 51, "medium 1;" should read --medium 1,--.

COLUMN 14

Line 50, "has been shown" should be deleted.

COLUMN 15

Line 20, "are" should read --is--.

COLUMN 16

TABLE 6, "Poly(4,4;-isopropylidene" should read --Poly(4,4-isopropylidene--.
Line 53, "or" should read --of--.
TABLE 7, "Poly(4,4;-isopropylidene" should read --Poly(4,4-isopropylidene-- and "iso-phthalate" should read --isophthalate--.

COLUMN 17

Line 53, "lamps 93b," should read --lamps 83b,--.

COLUMN 18

Line 16, "were" should read --was--.
Line 31, "roller 84c" should read --roller 84b--.
Line 44, "are" should read --is--.

UNITED STATES PATENT AND TRADEMARK OFFICE
CERTIFICATE OF CORRECTION

PATENT NO. : 5,072,245
DATED : December 10, 1991
INVENTOR(S) : Yasuyuki Tamura et al Page 3 of 5

It is certified that error appears in the above-indentified patent and that said Letters Patent is hereby corrected as shown below:

COLUMN 21

Line 53, "take up" should read --takeup--.
Line 55, "supply 102" should read --supply roller 102--.
Line 58, "rollers 112a, 112b," should read --rollers 110d, 112b--.

COLUMN 22

Line 47, "aldehide." should read --aldehyde.--.

COLUMN 23

Line 1, "drying and," should read --drying, and--.
Line 20, "generates" should read --generate--.
Line 39, "medium 201" should read --medium 101--.

COLUMN 24

Line 67, "rotatable" should read --rotatable and--.

COLUMN 25

Line 15, "roll 102" should read --roll 102.--.
Line 19, "arm 11e." should read --arm 110e.--.
Line 21, "substrate 101" should read --substrate 101a--.
Line 22, "medium 110" should read --medium 101--.
Line 34, "medium 110" should read --medium 101--.
Line 59, "gears 102 and 109b." should read --gears 102b and 109a.--.
Line 60, "plate 109" should read --plate 109c--.

UNITED STATES PATENT AND TRADEMARK OFFICE
CERTIFICATE OF CORRECTION

PATENT NO. : 5,072,245

DATED : December 10, 1991

INVENTOR(S) : Yasuyiki Tamura et al

Page 4 of 5

It is certified that error appears in the above-indentified patent and that said Letters Patent is hereby corrected as shown below:

COLUMN 26

Line 11, "plate 109" should read --plate 109c--.
    Line 16, "spring 100f." should read --spring 110f.--.
    Line 33, "arm 11e" should read --arm 110e--.
    Line 58, "medium 5," should read --medium 108,--.

COLUMN 28

Line 14, "Tables 3, 5" should read --Tables 3-5--.
    Line 51, "rollers 5a, 5d" should read --rollers 5a, 5b--.

COLUMN 29

Line 54, "although" should be deleted.
    Line 60, "method" should read --method in which--.
    Line 67, "which" should be deleted.

COLUMN 30

Line 8, "if" should read --in--.
    Line 66, "since" should be deleted.

COLUMN 31

Line 68, "along," should read --alone,--.

COLUMN 33

Line 59, "forming" should read --recording--.

UNITED STATES PATENT AND TRADEMARK OFFICE
CERTIFICATE OF CORRECTION

PATENT NO. : 5,072,245
DATED : December 10, 1991
INVENTOR(S) : Yasuyiki Tamura et al Page 5 of 5

It is certified that error appears in the above-indentified patent and that said Letters Patent is hereby corrected as shown below:

COLUMN 34

```
Line  8, "and fixing" should be deleted.
Line 16, "forming" should read --recording--.
Line 20, "forming" should read --recording--.
Line 23, "forming" should read --recording--.
Line 26, "forming" should read --recording--.
Line 56, "said" should read --a--.
```

Signed and Sealed this

Third Day of August, 1993

Attest:

MICHAEL K. KIRK

*Attesting Officer*    *Acting Commissioner of Patents and Trademarks*